(12) United States Patent
Lin et al.

(10) Patent No.: US 12,469,791 B2
(45) Date of Patent: Nov. 11, 2025

(54) SEMICONDUCTOR DEVICE AND METHOD OF STACKING HYBRID SUBSTRATES WITH EMBEDDED ELECTRIC COMPONENTS

(71) Applicant: STATS ChipPAC Pte. Ltd., Singapore (SG)

(72) Inventors: Yaojian Lin, Jiangsu Province (CN); Linda Pei Ee Chua, Singapore (SG); Ching Meng Fang, Singapore (SG); Hin Hwa Goh, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 521 days.

(21) Appl. No.: 17/936,037

(22) Filed: Sep. 28, 2022

(65) Prior Publication Data

US 2024/0105630 A1 Mar. 28, 2024

(51) Int. Cl.
*H01L 23/538* (2006.01)
*H01L 21/48* (2006.01)
(Continued)

(52) U.S. Cl.
CPC ...... *H01L 23/5385* (2013.01); *H01L 21/4853* (2013.01); *H01L 21/4857* (2013.01); *H01L 21/486* (2013.01); *H01L 21/561* (2013.01); *H01L 21/565* (2013.01); *H01L 21/568* (2013.01); *H01L 23/3135* (2013.01); *H01L 23/49816* (2013.01); *H01L 23/49822* (2013.01); *H01L 23/49833* (2013.01); *H01L 23/49838* (2013.01); *H01L 23/5386* (2013.01); *H01L 23/552* (2013.01); *H01L 24/16* (2013.01); *H01L 24/32* (2013.01); *H01L 24/73* (2013.01);
(Continued)

(58) Field of Classification Search
CPC .................................................. H01L 23/5385
See application file for complete search history.

(56) References Cited

U.S. PATENT DOCUMENTS

| 8,183,696 B2* | 5/2012 | Meyer ............... H01L 25/16 |
| | | 257/E21.705 |
| 9,385,009 B2* | 7/2016 | Lin .................. H01L 24/20 |

(Continued)

FOREIGN PATENT DOCUMENTS

CN 113161333 A 7/2021

*Primary Examiner* — William A Harriston
(74) *Attorney, Agent, or Firm* — Robert D. Atkins; PATENT LAW GROUP: Atkins and Associates, P.C.

(57) ABSTRACT

A semiconductor device has a first RDL substrate with first conductive pillars formed over a first surface of the first RDL substrate. A first electrical component is disposed over the first surface of the first RDL substrate. A hybrid substrate is bonded to the first RDL substrate. An encapsulant is deposited around the hybrid substrate and first RDL substrate with the first conductive pillars and first electrical component embedded within the encapsulant. A second RDL substrate with second conductive pillars formed over the second RDL substrate and second electrical component disposed over the second RDL substrate can be bonded to the hybrid substrate. A second RDL can be formed over a second surface of the first RDL substrate. A third electrical component is disposed over a second surface of the first RDL substrate. A shielding frame is disposed over the third electrical component.

21 Claims, 26 Drawing Sheets

(51) Int. Cl.
  *H01L 21/56* (2006.01)
  *H01L 23/00* (2006.01)
  *H01L 23/31* (2006.01)
  *H01L 23/498* (2006.01)
  *H01L 23/552* (2006.01)
  *H01L 25/16* (2023.01)

(52) U.S. Cl.
  CPC ............. *H01L 24/96* (2013.01); *H01L 24/97* (2013.01); *H01L 25/162* (2013.01); *H01L 25/165* (2013.01); *H01L 21/563* (2013.01); *H01L 24/81* (2013.01); *H01L 2224/16227* (2013.01); *H01L 2224/16238* (2013.01); *H01L 2224/32225* (2013.01); *H01L 2224/32245* (2013.01); *H01L 2224/73204* (2013.01); *H01L 2224/81203* (2013.01); *H01L 2224/95001* (2013.01); *H01L 2924/182* (2013.01); *H01L 2924/3511* (2013.01); *H01L 2924/3512* (2013.01); *H01L 2924/37001* (2013.01)

(56) References Cited

U.S. PATENT DOCUMENTS 9,941,207 B2 * 4/2018 Lin .................. H01L 21/78
2013/0052777 A1 * 2/2013 Xu .................. H01L 23/544
 257/E21.502
2013/0075924 A1 * 3/2013 Lin .................. H01L 23/3128
 438/109
2015/0001708 A1 * 1/2015 Lin .................. H01L 25/50
 257/737
2015/0318262 A1 * 11/2015 Gu .................. H01L 21/4857
 257/737
2016/0118333 A1 * 4/2016 Lin .................. H01L 21/6836
 257/773
2020/0043908 A1 * 2/2020 Chung .............. H01L 25/105
2020/0105544 A1 * 4/2020 Tsai ................. H01L 21/4853
2020/0239299 A1 * 7/2020 Liu .................. H05K 3/4605
2021/0082819 A1 * 3/2021 Wu .................. H01L 23/5385
2021/0217707 A1 * 7/2021 Tsai ................. H01L 23/49816
2021/0225780 A1    7/2021 Wu et al.
2021/0242117 A1    8/2021 Huang et al.
2021/0335726 A1   10/2021 Wu et al.
2023/0068587 A1 * 3/2023 Yoon ................. H01L 25/0652
2023/0073026 A1 * 3/2023 Elsherbini ......... H01L 24/80
2024/0047427 A1 * 2/2024 Tsai ................. H01L 24/14
2024/0063194 A1 * 2/2024 Lee .................. H01L 25/165
2024/0355749 A1 * 10/2024 Ecton ............... H01L 23/49816

* cited by examiner

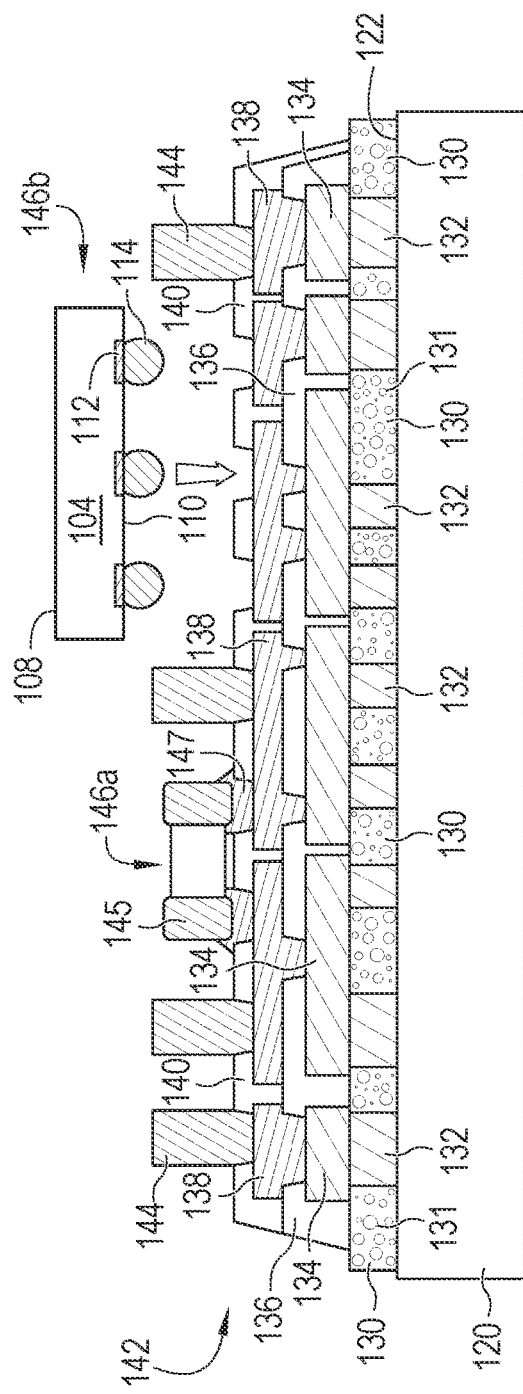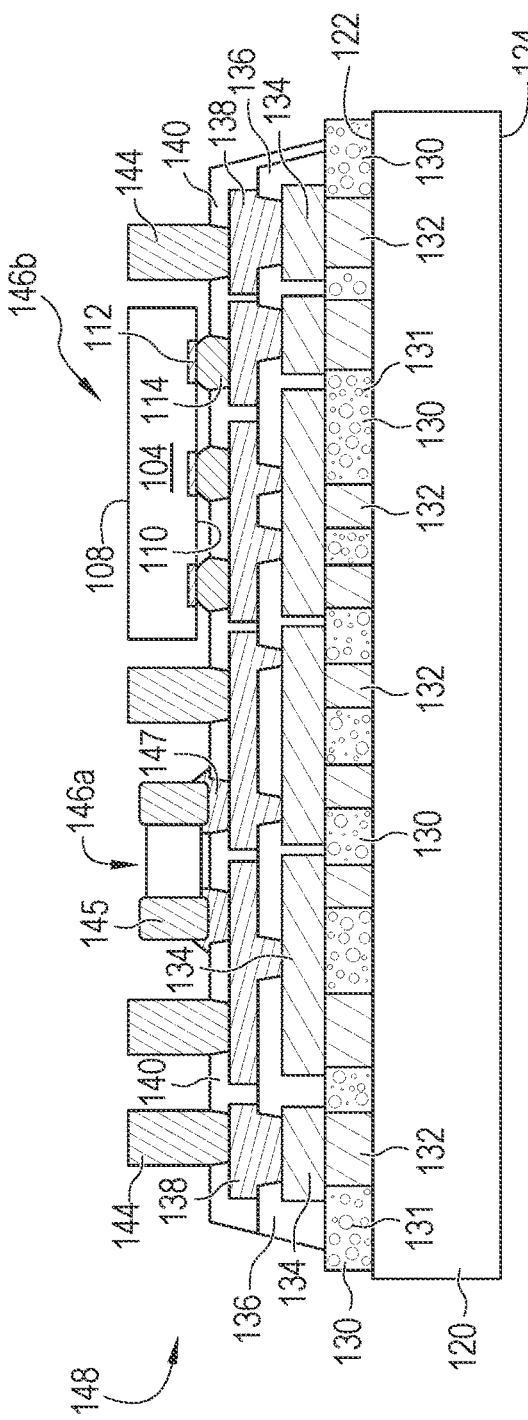

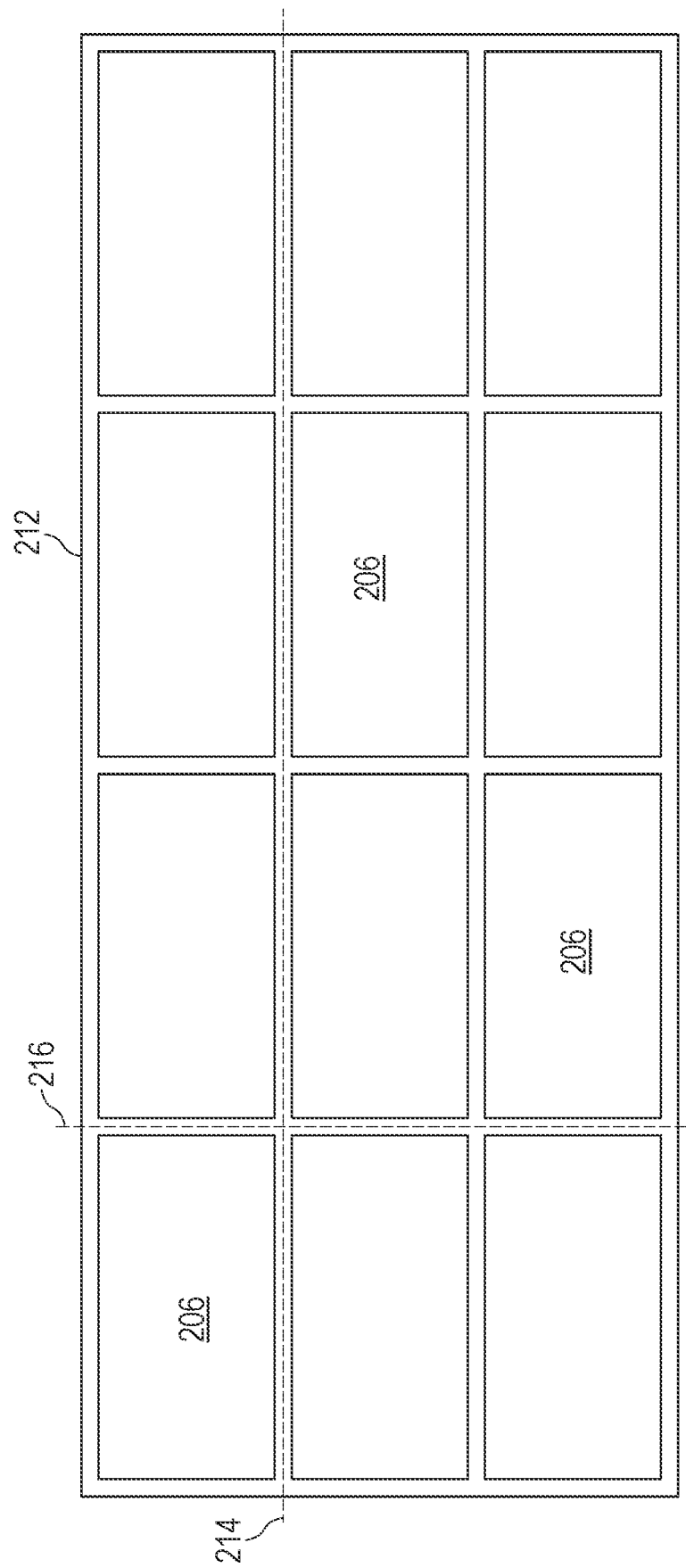

US 12,469,791 B2

SEMICONDUCTOR DEVICE AND METHOD OF STACKING HYBRID SUBSTRATES WITH EMBEDDED ELECTRIC COMPONENTS

FIELD OF THE INVENTION

The present invention relates in general to semiconductor devices and, more particularly, to a semiconductor device and method of stacking hybrid substrates with embedded electrical components.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices often contain a semiconductor die or substrate with electrical interconnect structures, e.g., redistribution layers (RDL) formed over one or more surfaces of the semiconductor die or substrate to perform necessary electrical functions. The semiconductor devices are formed wafer or panels during the manufacturing process. The wafer and panels are subject to warpage during formation of the RDL. Larger fan-out devices have higher risk of warpage and consequently lower yield leading to higher manufacturing costs. In addition, electrical components embedded with the package are lost to RDL induced defects. Embedded electrical components also have height constraints and cracking concerns, particular during any grinding process.

BRIEF DESCRIPTION OF THE DRAWINGS

FIGS. 2a-2h illustrate a process of forming RDL layers with electrical components and conductive pillars on a carrier;

FIG. 5 illustrates singulation of a hybrid substrate assembly panel;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
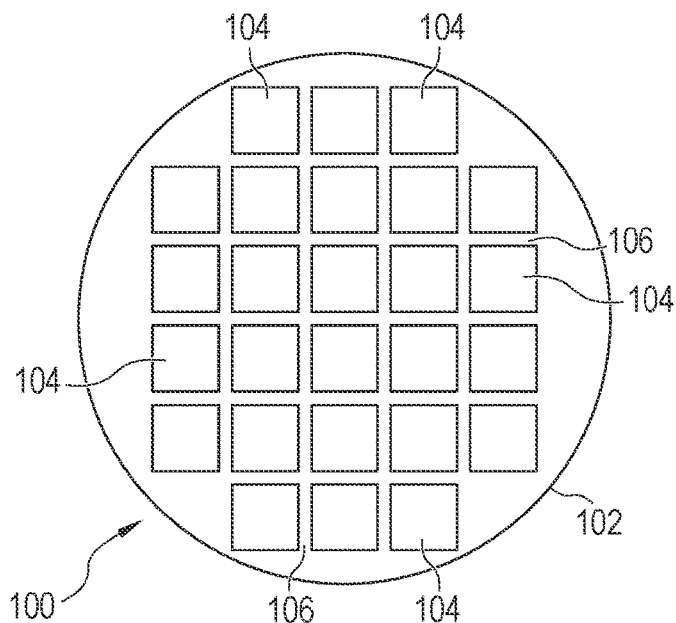
FIGS. 1a-1c illustrate a first semiconductor wafer with a plurality of first semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
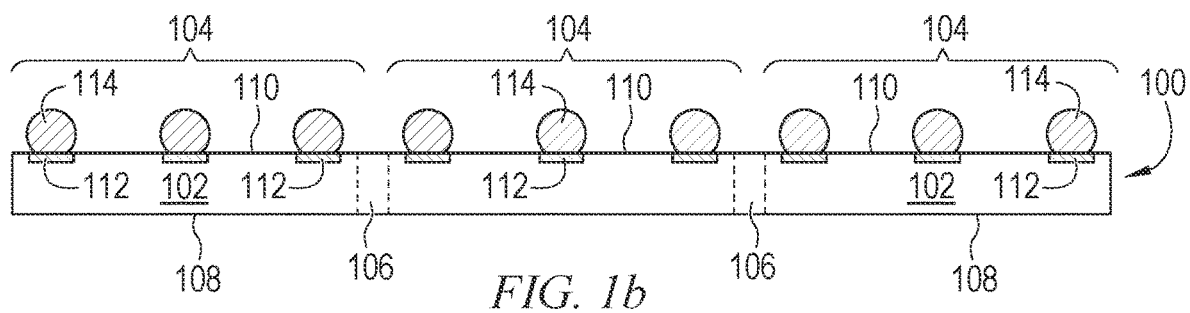

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
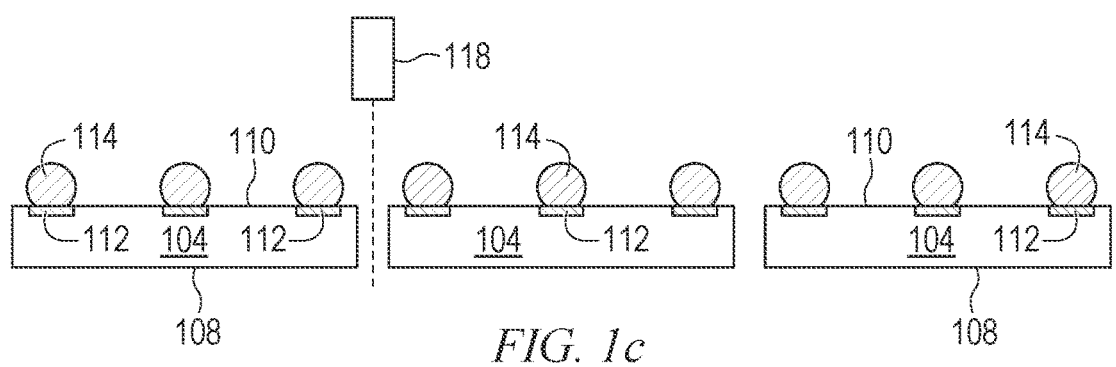

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 2A:
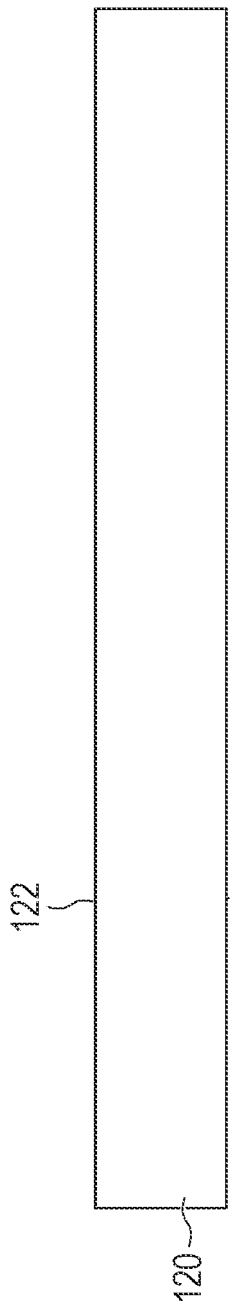

FIG. 2a shows a temporary substrate or carrier 120 sacrificial base material such as silicon, polymer, beryllium oxide, glass, or other suitable low-cost, rigid material for structural support. Semiconductor substrate 120 has major surfaces 122 and 124. In one embodiment, carrier 120 is a support structure with a temporary bonding layer to form electrical interconnect features over surfaces 122 and/or 124.

Figure 2B:
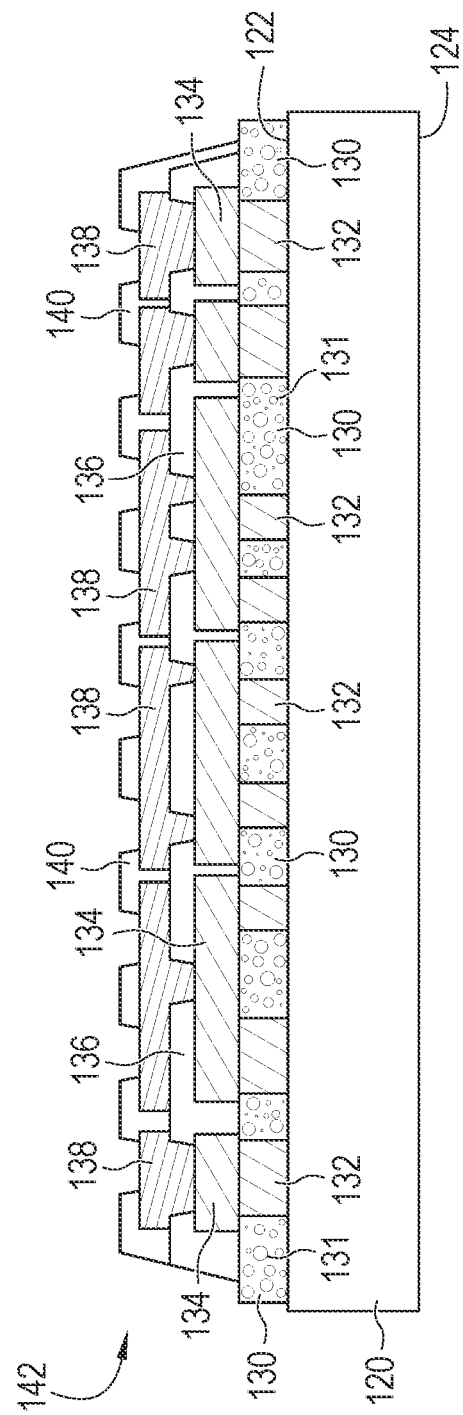

In FIG. 2b, insulating or passivation layer 130 is formed over surface 122 using PVD, CVD, printing, lamination, spin coating, spray coating, sintering or thermal oxidation. Insulating layer 130 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 130 includes one or more fillers 131, such as solder mask or molding sheet. Portions of insulating layer 130 may be removed using an etching process or laser direct ablation (LDA) for further electrical interconnect.

Conductive layer 132 is formed over surface 122 of carrier 120 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 is a contact pad. In one embodiment, conductive layer 132 has a thickness of less than 1.0 Portions of conductive layer 132 can be electrically common or electrically isolated depending on the design and function of semiconductor die and other electrical components attached thereto. Insulating layer 130 provides isolation around conductive layer 132.

Conductive layer 134 is formed over insulating layer 130 and conductive layer 132 using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 is a redistribution layer (RDL) and provides horizontal and vertical electrical interconnect. Portions of conductive layer 134 can be electrically common or electrically isolated depending on the design and function of semiconductor die and other electrical components attached thereto.

An insulating or passivation layer 136 is formed over insulating layer 130 and conductive layer 134 using PVD, CVD, printing, lamination, spin coating, spray coating, sintering or thermal oxidation. Insulating layer 136 contains one or more layers of SiO2, Si3N4, SiON, Ta2O5, Al2O3, solder resist, polyimide, BCB, PBO, and other material having similar insulating and structural properties. Insulating layer 136 provides isolation around conductive layer 134. Portions of insulating layer 136 are removed using an etching process or LDA to expose conductive layer 134 for further electrical interconnect.

Conductive layer 138 is formed over conductive layer 134 and insulating layer 136 using PVD, CVD, electrolytic plating, electroless plating process, or other suitable metal deposition process. Conductive layer 138 can be one or more layers of Al, Cu, Sn, Ni, Au, Ag, or other suitable electrically conductive material. Conductive layer 138 is an RDL and provides horizontal and vertical electrical interconnect. Portions of conductive layer 138 can be electrically common or electrically isolated depending on the design and function of semiconductor die and other electrical components attached thereto.

An insulating or passivation layer 140 is formed over insulating layer 136 and conductive layer 138 using PVD, CVD, printing, lamination, spin coating, spray coating, sintering or thermal oxidation. Insulating layer 140 contains one or more layers of SiO2, Si3N4, SiON, Ta2O5, Al2O3, solder resist, polyimide, BCB, PBO, and other material having similar insulating and structural properties. Insulating layer 140 provides isolation around conductive layer 138. Portions of insulating layer 140 are removed using an etching process or LDA to expose conductive layer 138 for further electrical interconnect. The combination of conductive layers 132, 134, and 138 and insulating layers 130, 136, and 140 constitute RDL stack 142 formed on carrier 120.

Figure 2C:
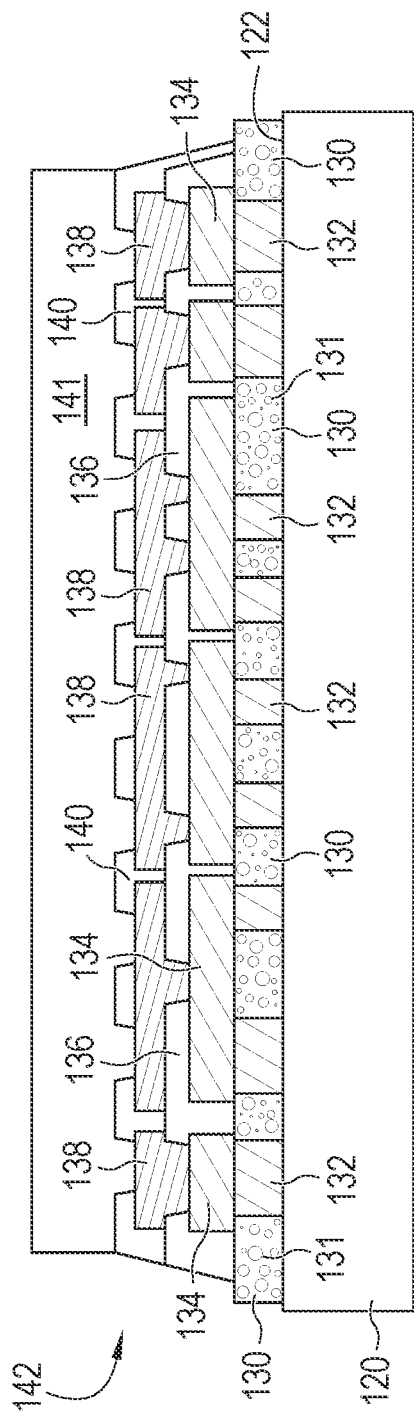
Figure 2D:
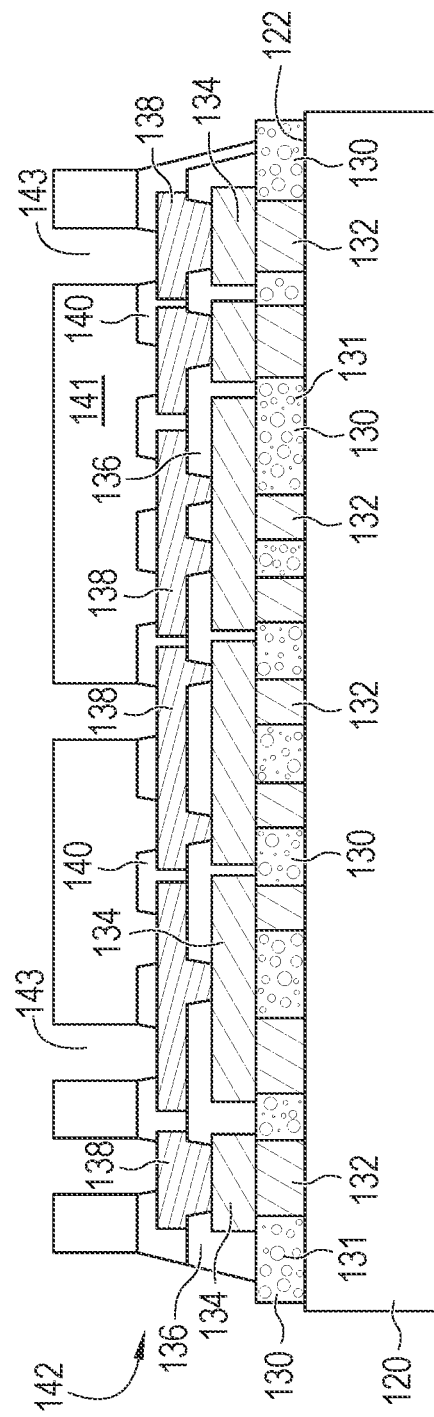
Figure 2E:
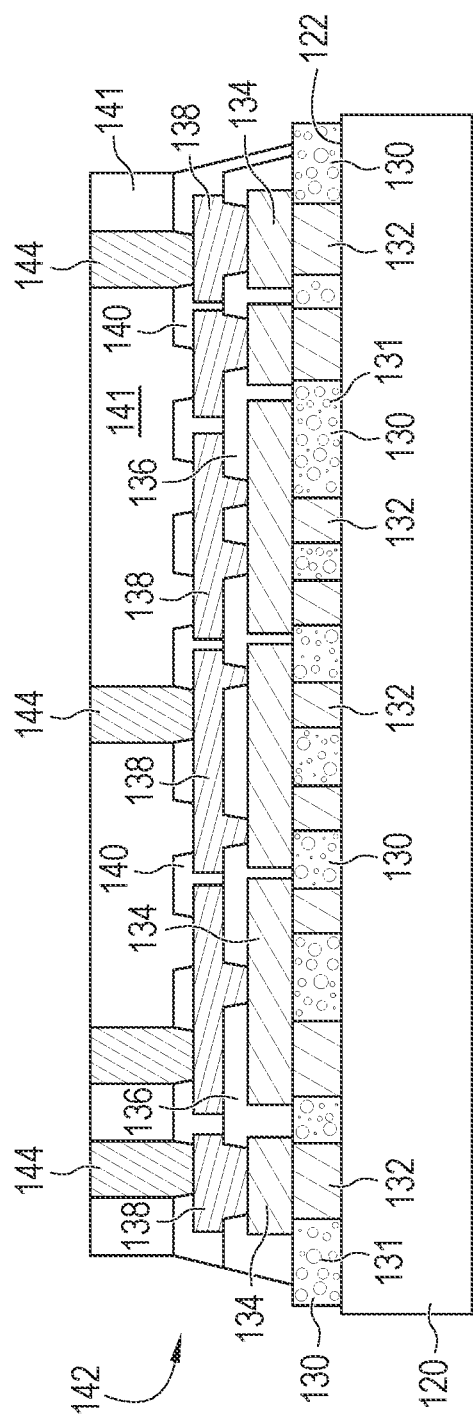
Figure 2F:
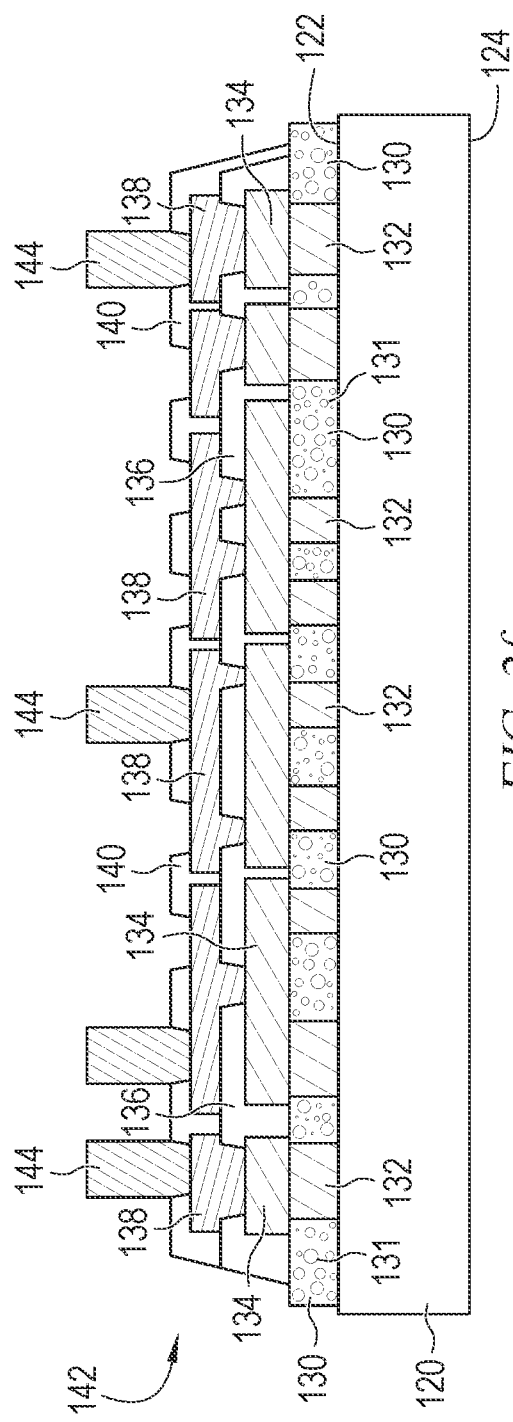

In FIG. 2c, solder resist or photoresist layer 141 is formed over conductive layer 138 and insulating layer 140. In FIG. 2d, a plurality of openings 143 is formed in solder resist/photoresist using an etching process or LDA to define a pattern to form conductive columns or pillars. Openings 143 are filled with conductive material, as shown in FIG. 2e. In FIG. 2f, the remaining solder resist/photoresist 141 is removed leaving conductive columns or pillars or post 144. Conductive columns or pillars or post 144 can be Al, Cu, Sn, Ni, Au, Ag, multi-layer combined or other suitable electrically conductive material. Conductive pillars 144 can have a height of less than 5.0 μm to compensate for thickness variation in different technologies, such as surface mount and flipchip.

In FIG. 2g, a plurality of electrical components 146a-146b is disposed on RDL stack 142 and electrically and mechanically connected to conductive layer 138. Electrical components 146a-146b are each positioned over RDL stack 142 using a pick and place operation. For example, electrical component 146b can be similar to semiconductor die 104 from FIG. 1c with bumps 114 oriented toward RDL stack 142. Electrical component 146a can be discrete electrical devices, or IPDs, such as a diode, transistor, resistor, capacitor, and inductor. Alternatively, electrical components 146a-146b can include other semiconductor die, semiconductor packages, surface mount devices, discrete electrical devices, or IPDs.

Electrical components 146a-146b are brought into contact with conductive layer 138 of RDL stack 142. Electrical component 146b is electrically and mechanically connected to conductive layer 138 by reflowing bumps 114. Terminals 145 of electrical components 146a are electrically and mechanically connected to conductive layer 138 using solder or conductive paste 147. FIG. 2h illustrates electrical components 146a-146b electrically and mechanically connected to RDL stack 142 between conductive pillars 144. Alternatively, conductive pillars 144 are formed on conductive layer 138 after electrical components 146a-146b are mounted to RDL stack 142. The combination of RDL stack 142, conductive pillars 144, and electrical components 146a-146b constitute RDL component assembly 148 formed on carrier 120.

Figure 3A:
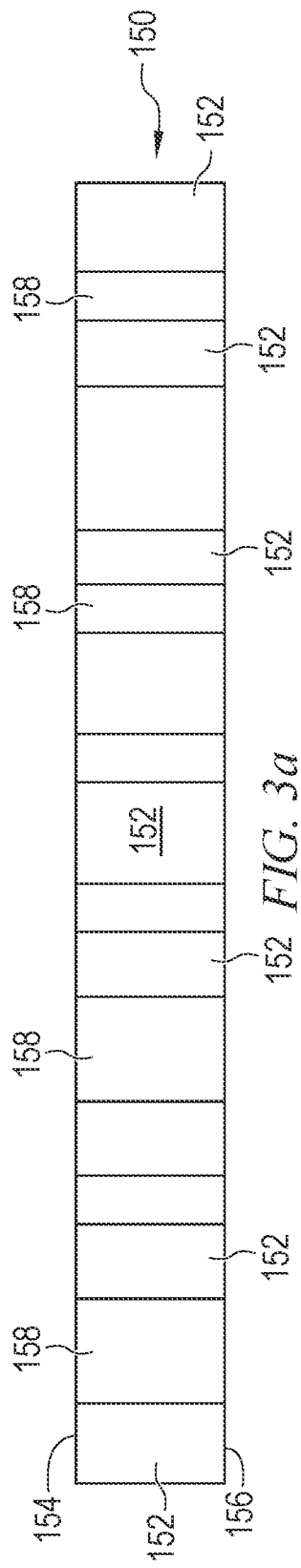
FIGS. 3a-3h illustrate a process of forming a hybrid substrate.

FIG. 3a shows a semiconductor wafer or panel substrate 150 with a base substrate material 152, such as silicon, germanium, aluminum phosphide, aluminum arsenide, gallium arsenide, gallium nitride, indium phosphide, silicon carbide, polymer (like Epoxy, polyimide) matrix composite materials with fillers and/or fibers, or other bulk material without insulation/dielectric property (for example resistivity >$1 \times 10^{10}$ ohm·cm) for structural/insulation support. Semiconductor substrate 150 has major surfaces 154 and 156. In one embodiment, semiconductor substrate 150 is a support structure to form electrical interconnect features over surfaces 154 and 156.

Alternatively, wafer 150 can have semiconductor devices formed on surface 154 and/or surface 156. An active surface 154 and/or 156 would contain analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within surface 154 and/or 156 to implement analog circuits or digital circuits, such as DSP, ASIC, memory, or other signal processing circuit. Active surface 154 and/or 156 may also contain IPDs, such as inductors, capacitors, and resistors, for RF signal processing.

Figure 3B:
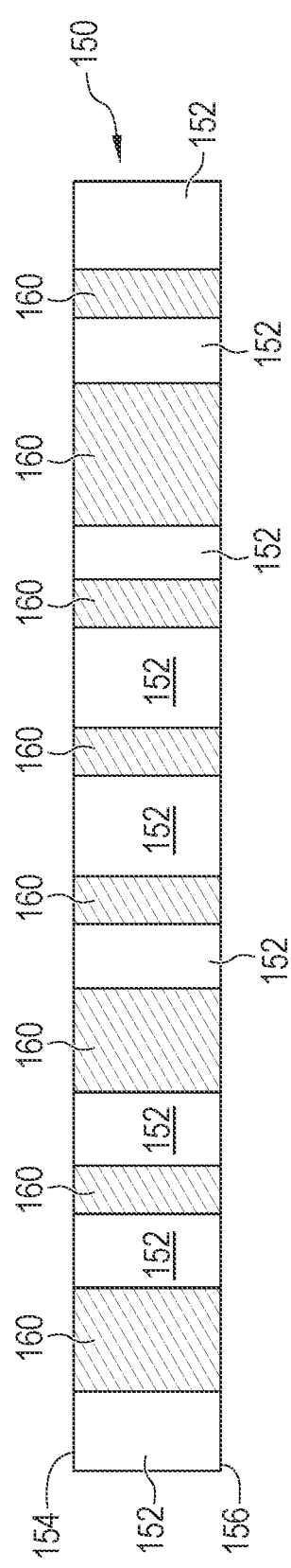

A plurality of through vias/holes 158 are formed completely through substrate 150. An optional solder resist/photoresist can be formed over surface 154. The solder resist/photoresist defines a pattern to etch vias 158 completely through base semiconductor material 152. Alternatively, vias/holes 158 could be formed by mechanical drilling or laser drilling. In FIG. 3b, vias 158 are filled or via sidewalls are plated with conductive material and the solder resist/photoresist is removed leaving conductive vias 160. Conductive vias 160 can be Al, Cu, Sn, Ni, Au, Ag, or other suitable electrically conductive material.

Figure 3C:
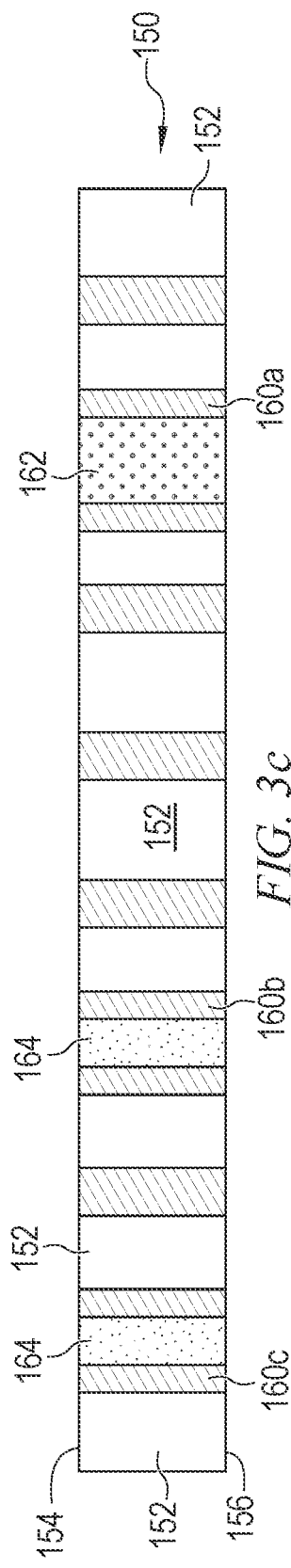

In FIG. 3c, a variety of core/plugging materials can be formed in conductive vias 160. A solder resist/photoresist can be formed over surface 154. The solder resist/photoresist defines a pattern to etch vias through previously formed conductive vias 160. For example, a via is formed through each of conductive vias 160a, 160b, and 160c. Alternatively, vias 158 are plated with metal at sidewalls without additional patterning and etching. The via formed through conductive via 160a is filled with plated magnetic materials or paste 162 to provide for tuning inductance. Magnetic material 162 can be iron, ferrite (nickel ferrite, nickel zinc ferrite, YIG ferrite), or other suitable magnetic powder or combinations thereof. Magnetic material 162 can be a plated magnetic film, such as NiFe, CoNiFe, or CoZrTa. In one embodiment, magnetic material 162 is a low-temperature (<200° C.) pressure-less curable powder paste, such as H701 and K250 from Ajinomoto. The vias formed through conductive vias 160b and 160c are filled with plated Cu or Cu paste 164 to improve thermal performance.

Figure 3D:
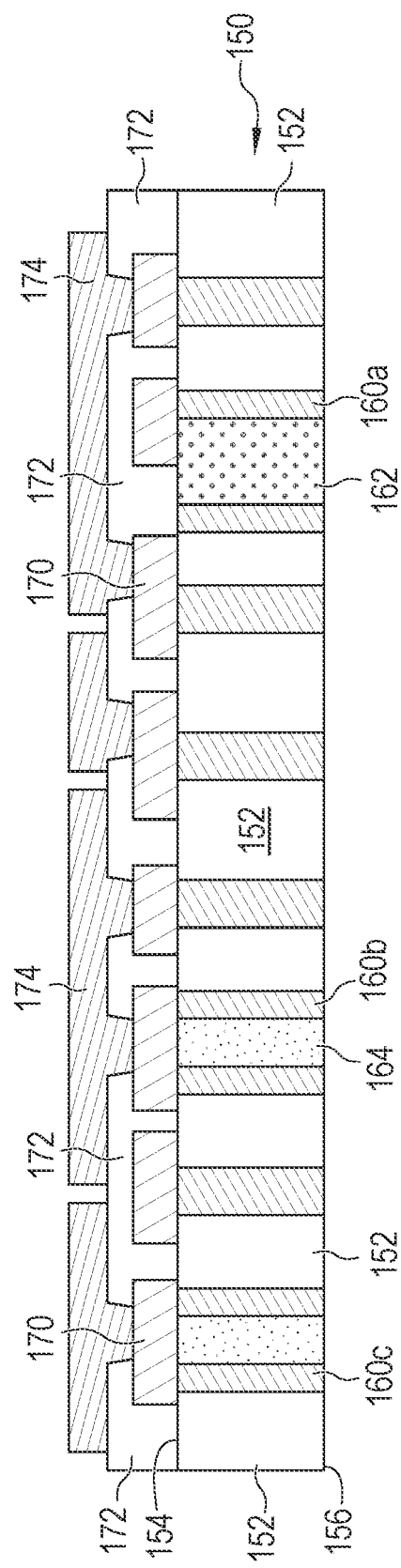

In FIG. 3d, conductive layer 170 is formed over surface 154 of substrate 150 using PVD, CVD, electrolytic plating, electroless plating process, or other suitable metal deposition process. Conductive layer 170 can be one or more layers of Al, Cu, Sn, Ni, Au, Ag, or other suitable electrically conductive material. Conductive layer 170 is an RDL and provides horizontal electrical interconnect across substrate 150 and vertical electrical interconnect to conductive vias 160. Portions of conductive layer 170 can be electrically common or electrically isolated depending on the design and function of semiconductor die and other electrical components attached thereto.

An insulating or passivation layer 172 is formed over surface 154 and conductive layer 170 using PVD, CVD, printing, lamination, spin coating, spray coating, sintering or thermal oxidation. Insulating layer 172 contains one or more layers of SiO2, Si3N4, SiON, Ta2O5, Al2O3, solder resist, polyimide, BCB, PBO, and other material having similar insulating and structural properties. Insulating layer 172 provides isolation around conductive layer 170. Portions of insulating layer 172 are removed using an etching process or LDA to expose conductive layer 170 for further electrical interconnect.

A conductive layer 174 is formed over conductive layer 170 and insulating layer 172 using PVD, CVD, electrolytic plating, electroless plating process, or other suitable metal deposition process. Conductive layer 174 can be one or more layers of Al, Cu, Sn, Ni, Au, Ag, or other suitable electrically conductive material. Conductive layer 174 is an RDL and provides horizontal electrical interconnect across substrate 150 and vertical electrical interconnect to conductive vias 160. Portions of conductive layer 174 can be electrically common or electrically isolated depending on the design and function of semiconductor die and other electrical components attached thereto.

Figure 3E:
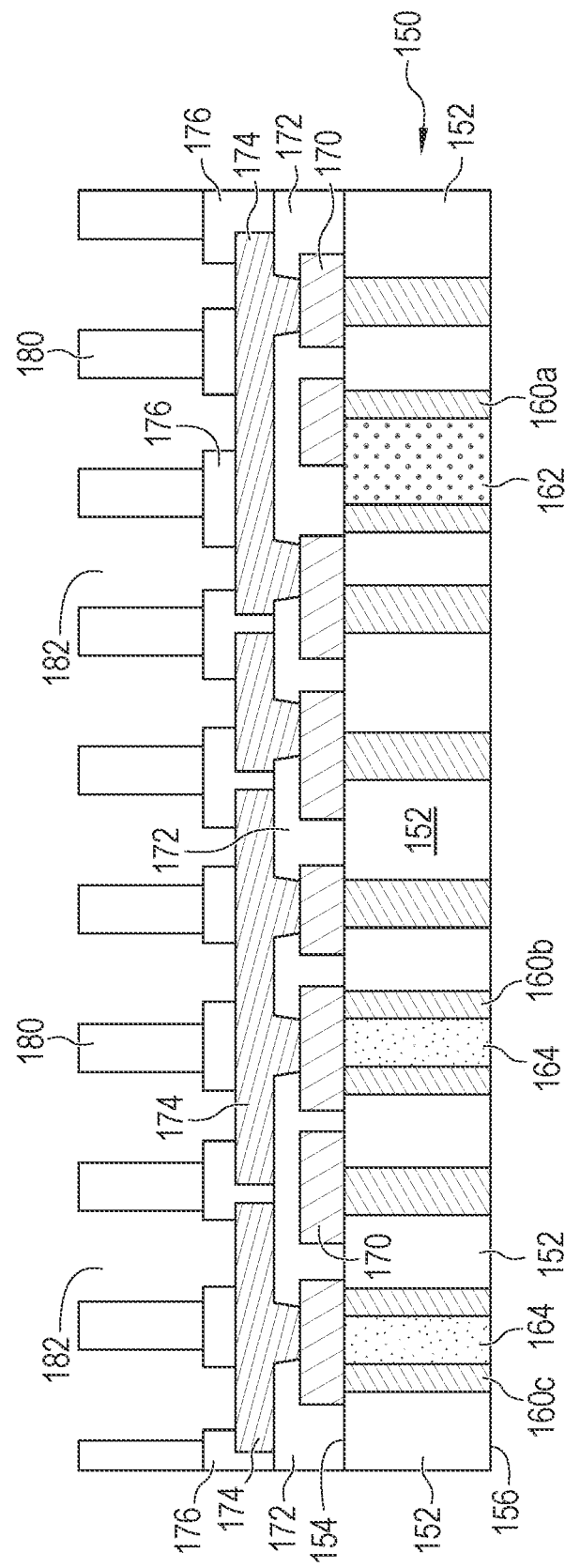

In FIG. 3e, insulating or passivation layer 176 is formed over insulating layer 172 and conductive layer 174 using PVD, CVD, printing, lamination, spin coating, spray coating, sintering or thermal oxidation. Insulating layer 176 contains one or more layers of SiO2, Si3N4, SiON, Ta2O5, Al2O3, solder resist, polyimide, BCB, PBO, and other material having similar insulating and structural properties. Insulating layer 176 provides isolation around conductive layer 174. Portions of insulating layer 176 are removed using an etching process or LDA to expose conductive layer 174 for further electrical interconnect.

Figure 3F:
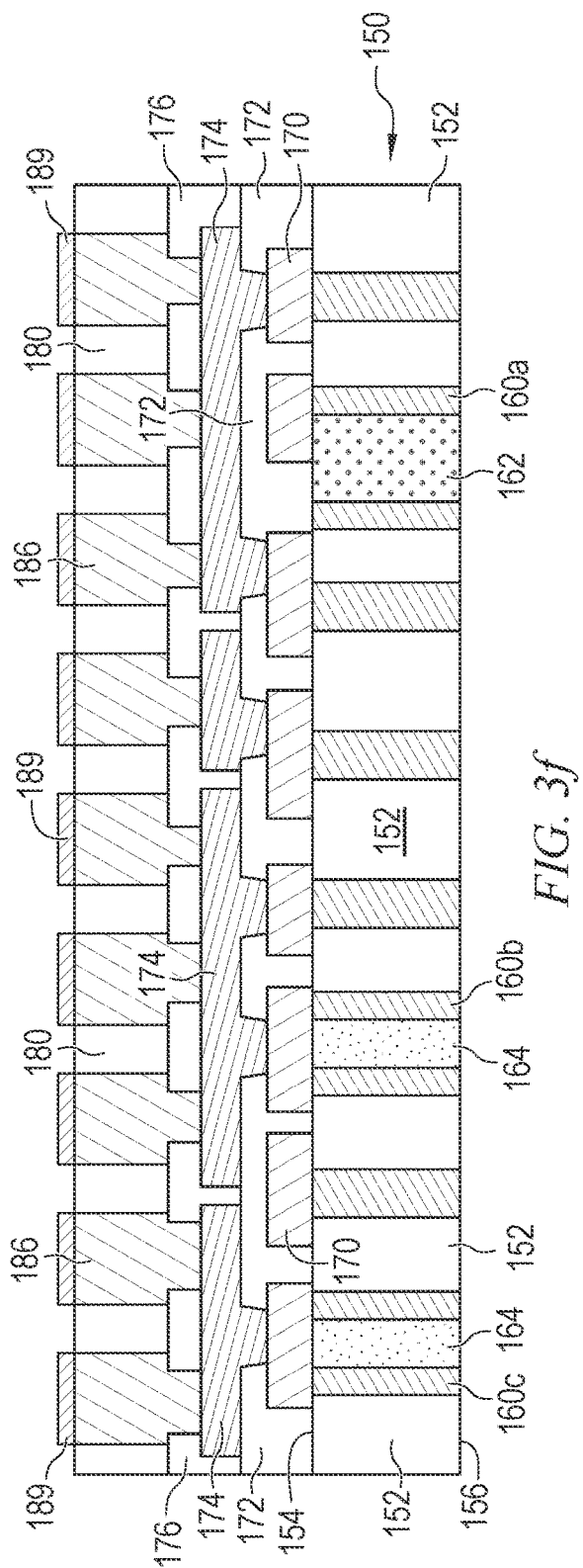
Figure 3G:
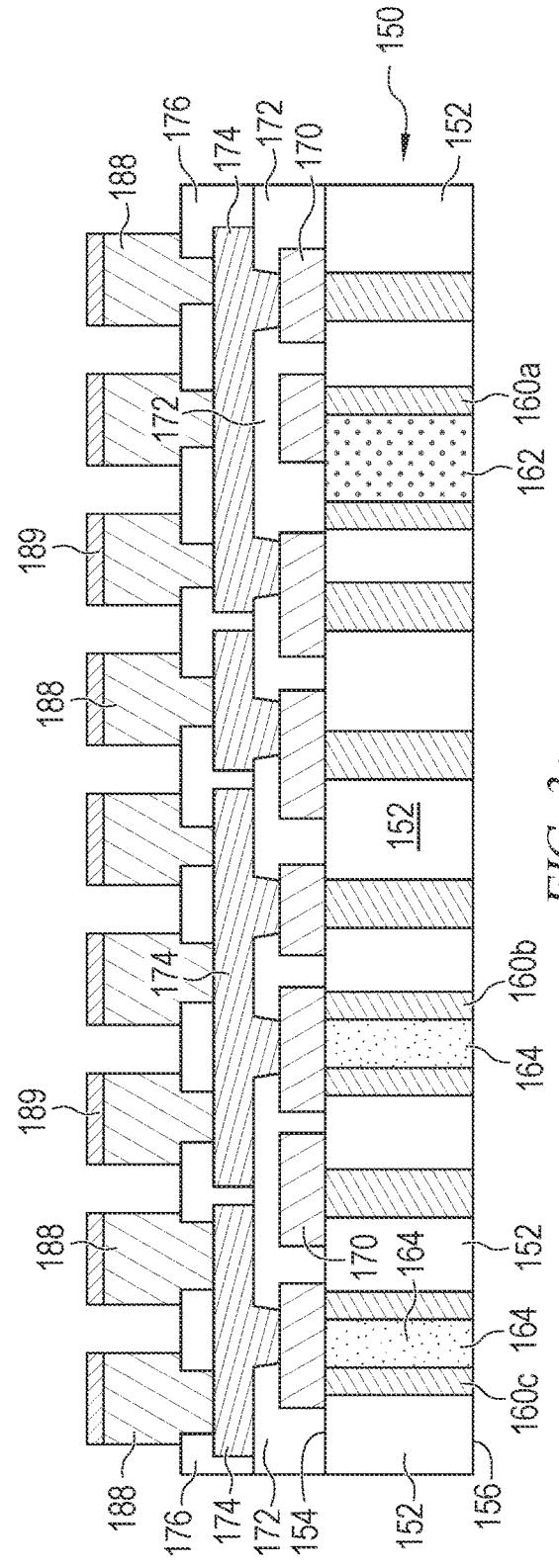

Solder resist or photoresist layer 180 is formed over insulating layer 176. A plurality of openings 182 is formed in solder resist/photoresist using an etching process or LDA to define a pattern to form conductive columns or pillars. Openings 182 are filled with conductive material 186, as shown in FIG. 3f. In FIG. 3g, the remaining solder resist/photoresist 180 is removed leaving conductive columns or pillars or post 188. Conductive columns or pillars or post 188 can be Al, Cu, Sn, Ni, Au, Ag, multi-layer combined or other suitable electrically conductive material. Conductive pillars 188 can have a height of less than 5.0 µm to compensate for thickness variation in different technologies, such as surface mount and flipchip. In one embodiment, conductive pillars 188 may have Cu organic solderability preservative (OSP), or electroless-nickel electroless-palladium immersion gold (ENEPIG), or electroless nickel immersion gold (ENIG), or immerging tin, or solder cap finish or layer 189 formed on exposed pads or metal surfaces. BGA balls can be used instead of conductive pillars 188.

Figure 3H:
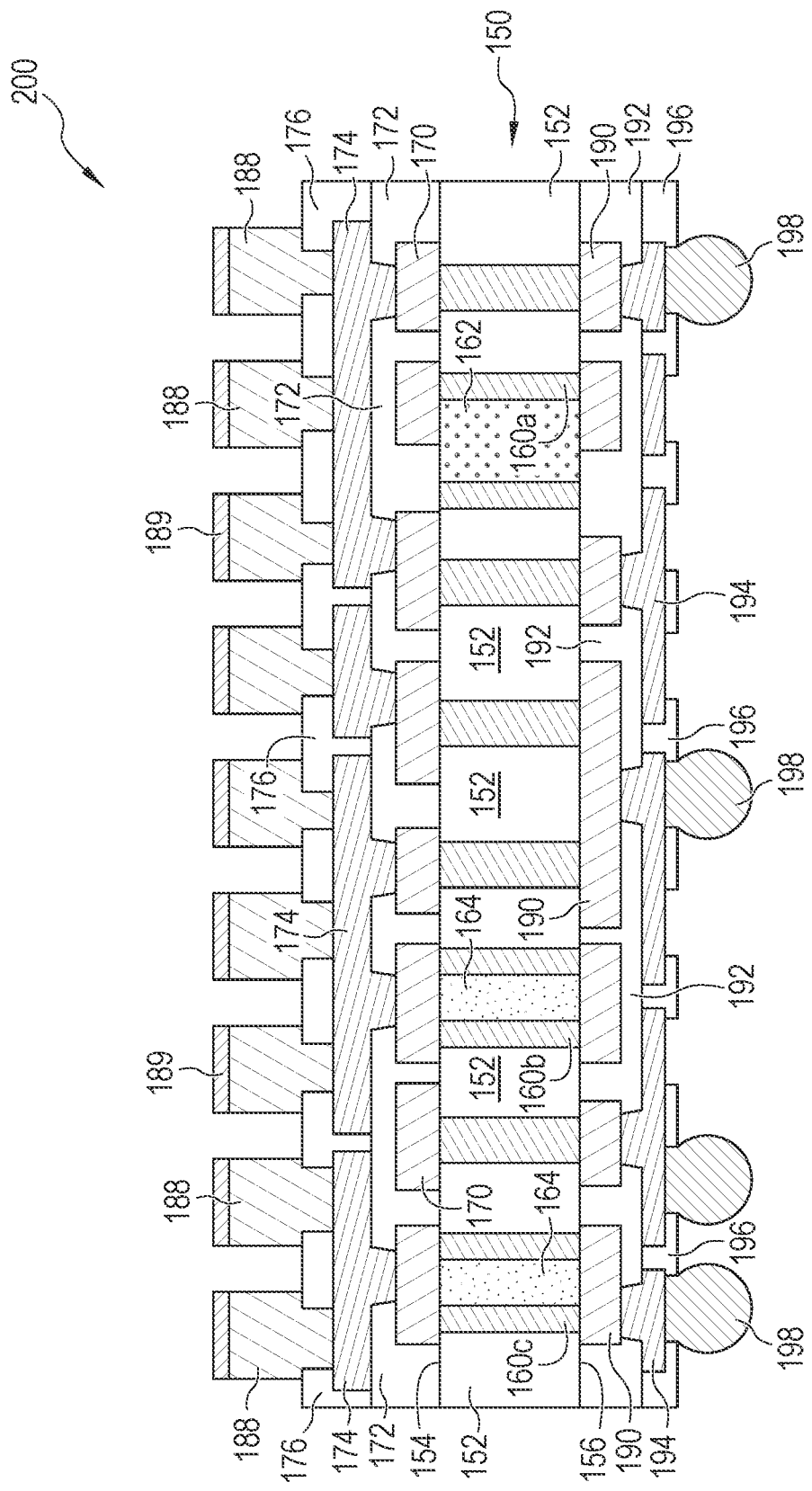

In FIG. 3h, conductive layer 190 is formed over surface 156 using PVD, CVD, electrolytic plating, electroless plating process, or other suitable metal deposition process. Conductive layer 190 can be one or more layers of Al, Cu, Sn, Ni, Au, Ag, or other suitable electrically conductive material. Conductive layer 190 is an RDL and provides horizontal and vertical electrical interconnect across substrate 150. Portions of conductive layer 190 can be electrically common or electrically isolated depending on the design and function of semiconductor die and other electrical components attached thereto.

An insulating or passivation layer 192 is formed over surface 156 and conductive layer 190 using PVD, CVD, printing, lamination, spin coating, spray coating, sintering or thermal oxidation. Insulating layer 192 contains one or more layers of SiO2, Si3N4, SiON, Ta2O5, Al2O3, solder resist, polyimide, BCB, PBO, and other material having similar insulating and structural properties. Insulating layer 192 provides isolation around conductive layer 190. Portions of insulating layer 192 are removed using an etching process or LDA to expose conductive layer 190 for further electrical interconnect.

A conductive layer 194 is formed over conductive layer 190 and insulating layer 192 using PVD, CVD, electrolytic plating, electroless plating process, or other suitable metal deposition process. Conductive layer 194 can be one or more layers of Al, Cu, Sn, Ni, Au, Ag, or other suitable electrically conductive material. Conductive layer 194 is an RDL and provides horizontal and vertical electrical interconnect across substrate 150. Portions of conductive layer 194 can be electrically common or electrically isolated depending on the design and function of semiconductor die and other electrical components attached thereto.

An insulating or passivation layer 196 is formed over conductive layer 194 and insulating layer 192 using PVD, CVD, printing, lamination, spin coating, spray coating, sintering or thermal oxidation. Insulating layer 196 contains one or more layers of SiO2, Si3N4, SiON, Ta2O5, Al2O3, solder resist, polyimide, BCB, PBO, and other material having similar insulating and structural properties. Insulating layer 196 provides isolation around conductive layer 194. Portions of insulating layer 196 are removed using an etching process or LDA to expose conductive layer 194 for further electrical interconnect.

An electrically conductive bump material is deposited over conductive layer 194 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 194 using a suitable attachment or bonding process. In one embodiment, the bump material is reflowed by heating the material above its melting point to form balls or bumps 198. In one embodiment, bump 198 is formed over a UBM having a wetting layer, barrier layer, and adhesive layer. Bump 198 can also be compression bonded or thermocompression bonded to conductive layer 194. In one embodiment, bump 198 is a copper core bump for durability and maintaining its height. Bump 198 represents one type of interconnect structure that can be formed over conductive layer 194. The interconnect structure can also use bond wires, conductive paste, stud bump, micro bump, or other electrical interconnect.

Substrate 150 is embedded between conductive layers 170, 174, 190, and 194, and insulating layers 172, 176, 192, and 196, which constitutes an interconnect structure with an embedded substrate. The combination of embedded substrate 150 with conductive layers 170, 174, 190, and 194, and insulating layers 172, 176, 192, and 196, conductive pillars 188, and bumps 198 constitute hybrid substrate 200. Hybrid substrate 200 may have the same number or more RDL layers as RDL stack 142.

Figure 4A:
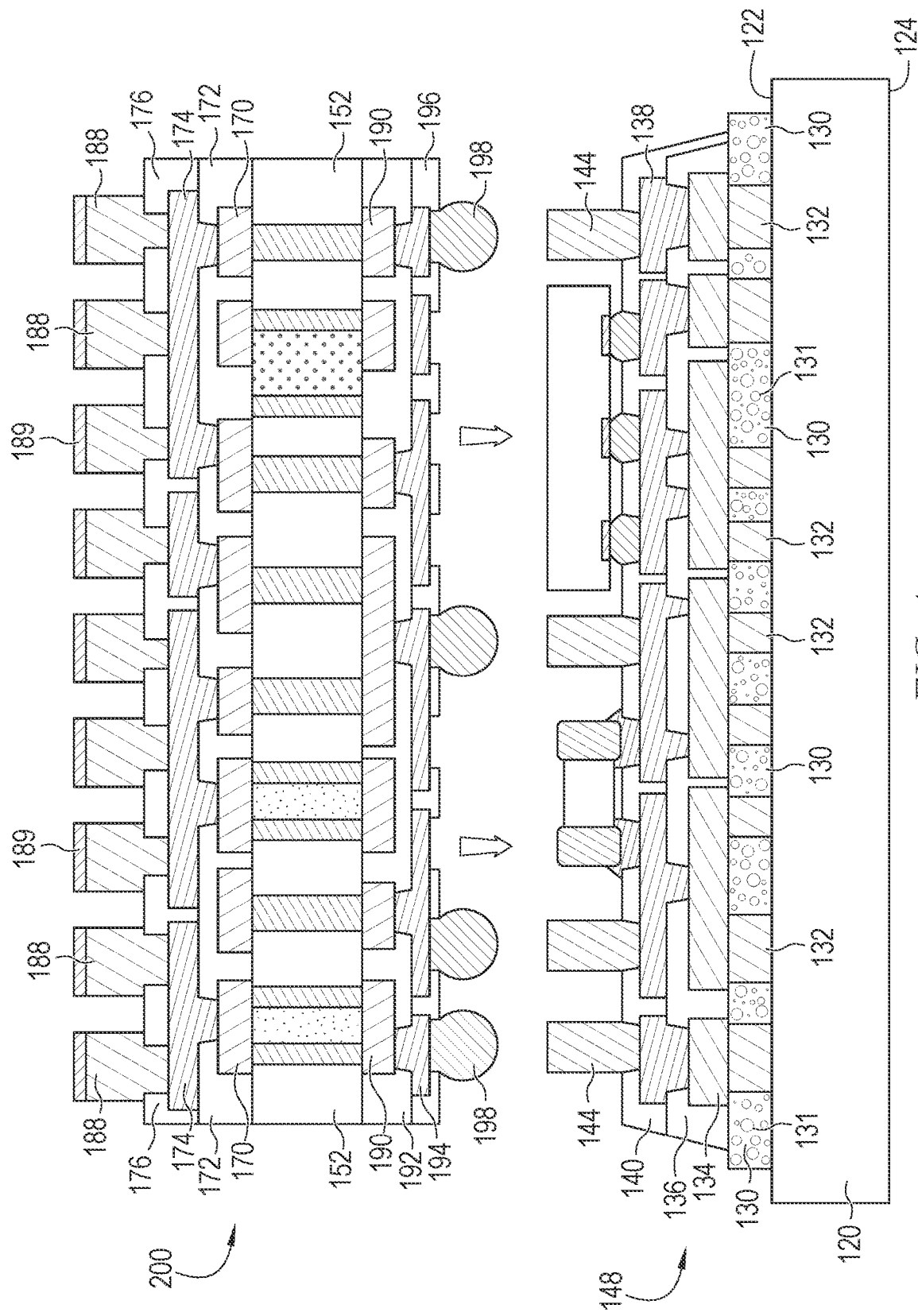
FIGS. 4a-4f illustrate a process of forming a hybrid substrate assembly.
Figure 4B:
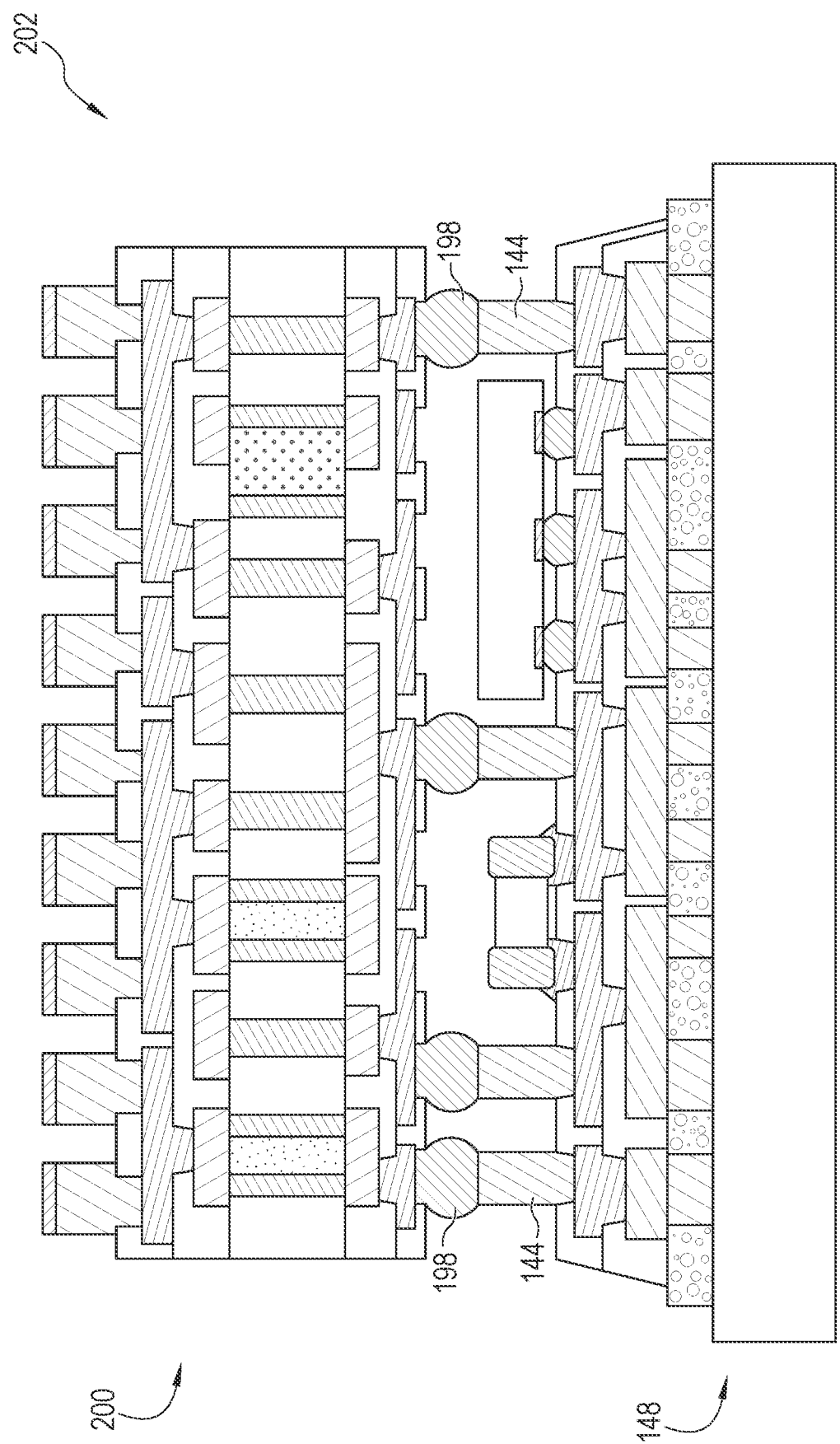
Figure 4C:
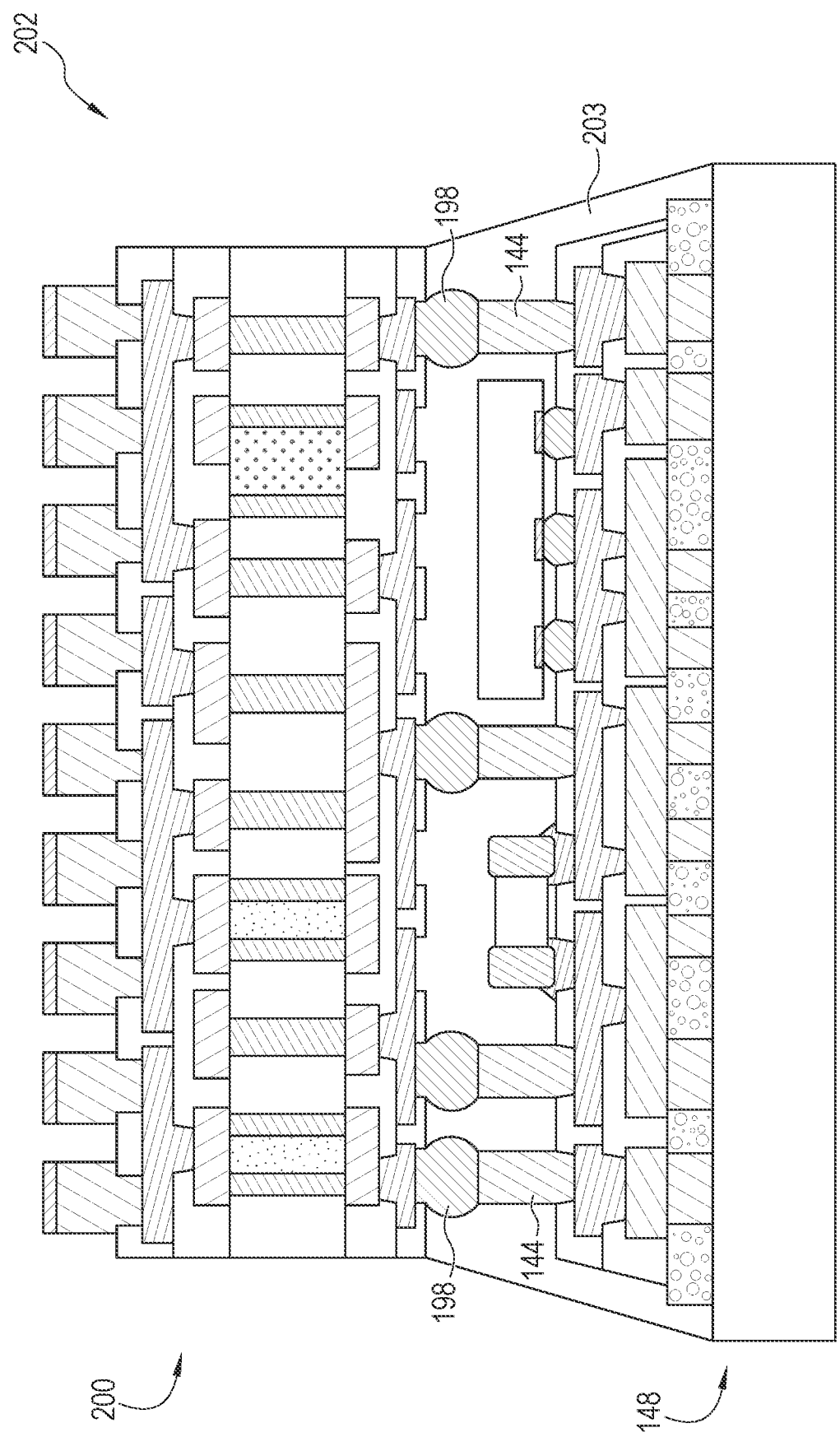

In FIG. 4a, hybrid substrate 200 is disposed over RDL component assembly 148 as formed on carrier 120 from FIG. 2h. Bumps 198 are brought into contact with conductive pillars 144 and reflowed to mechanically and electrically connect hybrid substrate 200 to RDL component assembly 148, indicated as hybrid substrate assembly 202 and shown in FIG. 4b. In FIG. 4c, an underfill material 203, such as epoxy resin, can be deposited around bumps 198 and portions of hybrid substrate assembly 202.

Figure 4D:
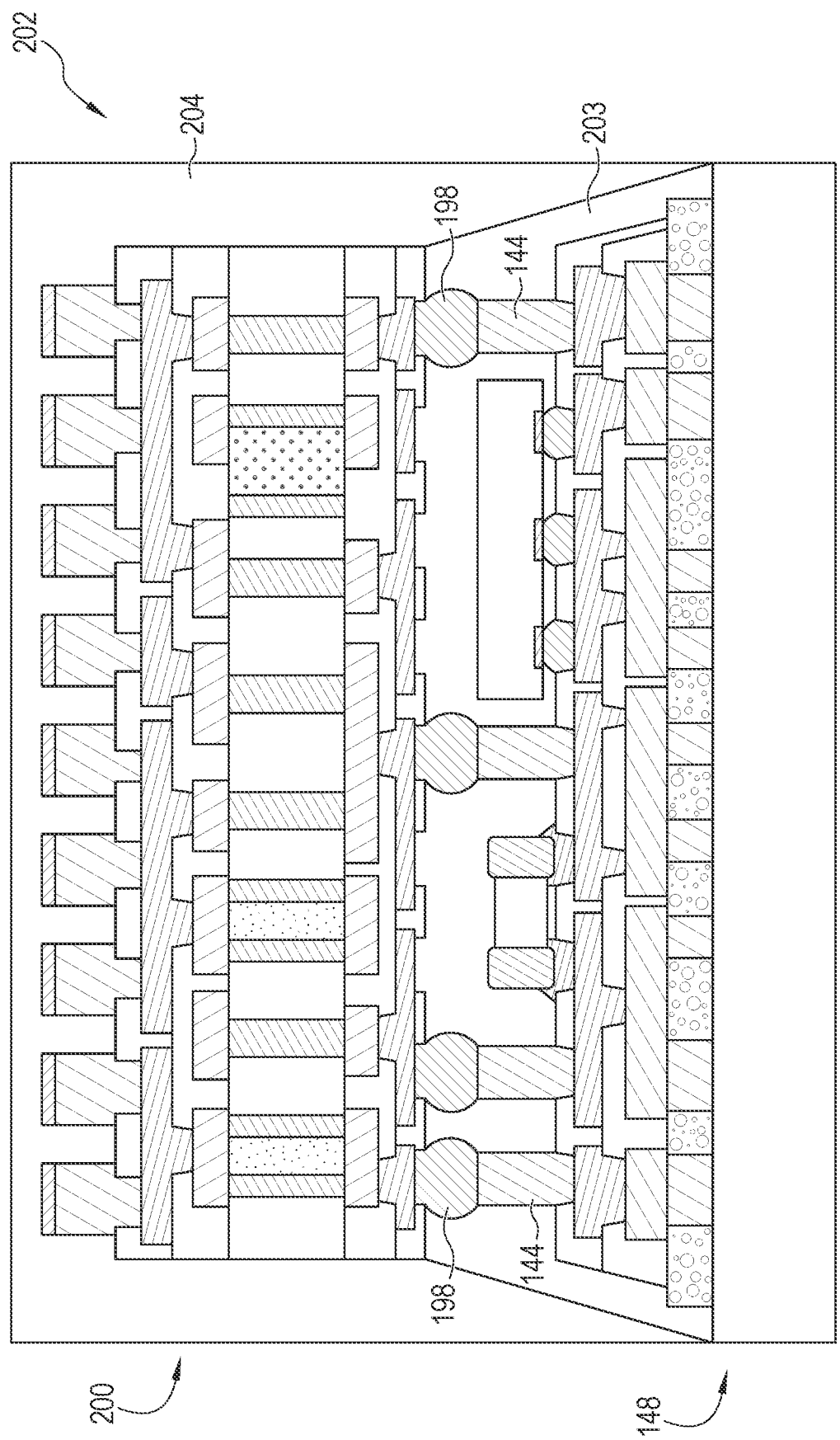

In FIG. 4d, encapsulant or molding compound 204 is deposited over and around hybrid substrate assembly 202 using a paste printing, compressive molding, transfer molding, liquid encapsulant molding, vacuum lamination, spin coating, or other suitable applicator. Encapsulant 204 can be liquid or granular polymer composite material, such as epoxy resin with filler, epoxy acrylate with filler, or polymer with proper filler. Encapsulant 204 is non-conductive, provides structural support, and environmentally protects the semiconductor device from external elements and contaminants. In particular, encapsulant 204 is deposited post formation of hybrid substrate assembly 202. Conductive pillars 144, electrical components 146a-146b, and bumps 198 are embedded within underfill material 203 and encapsulant 204.

Figure 4E:
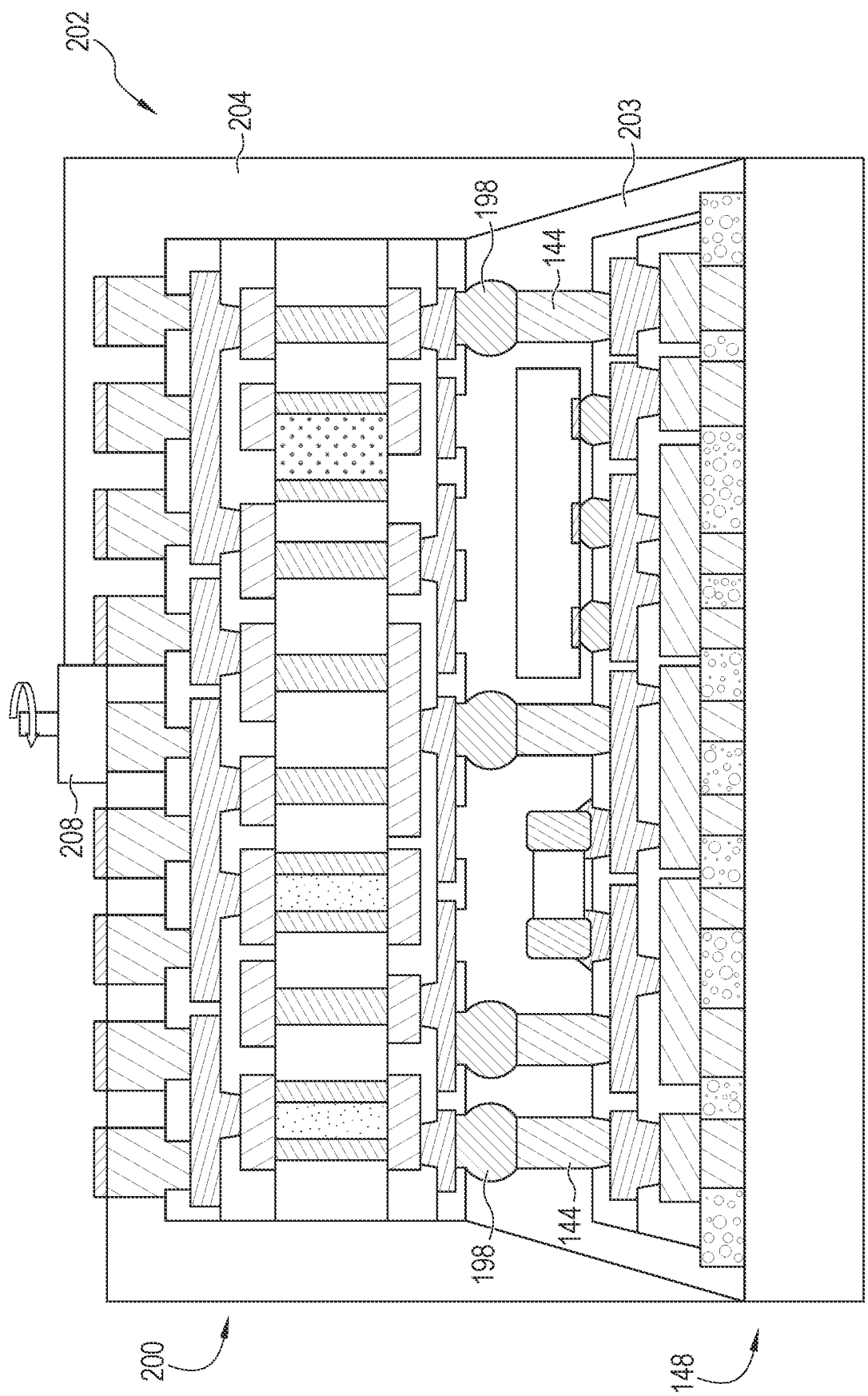
Figure 4F:
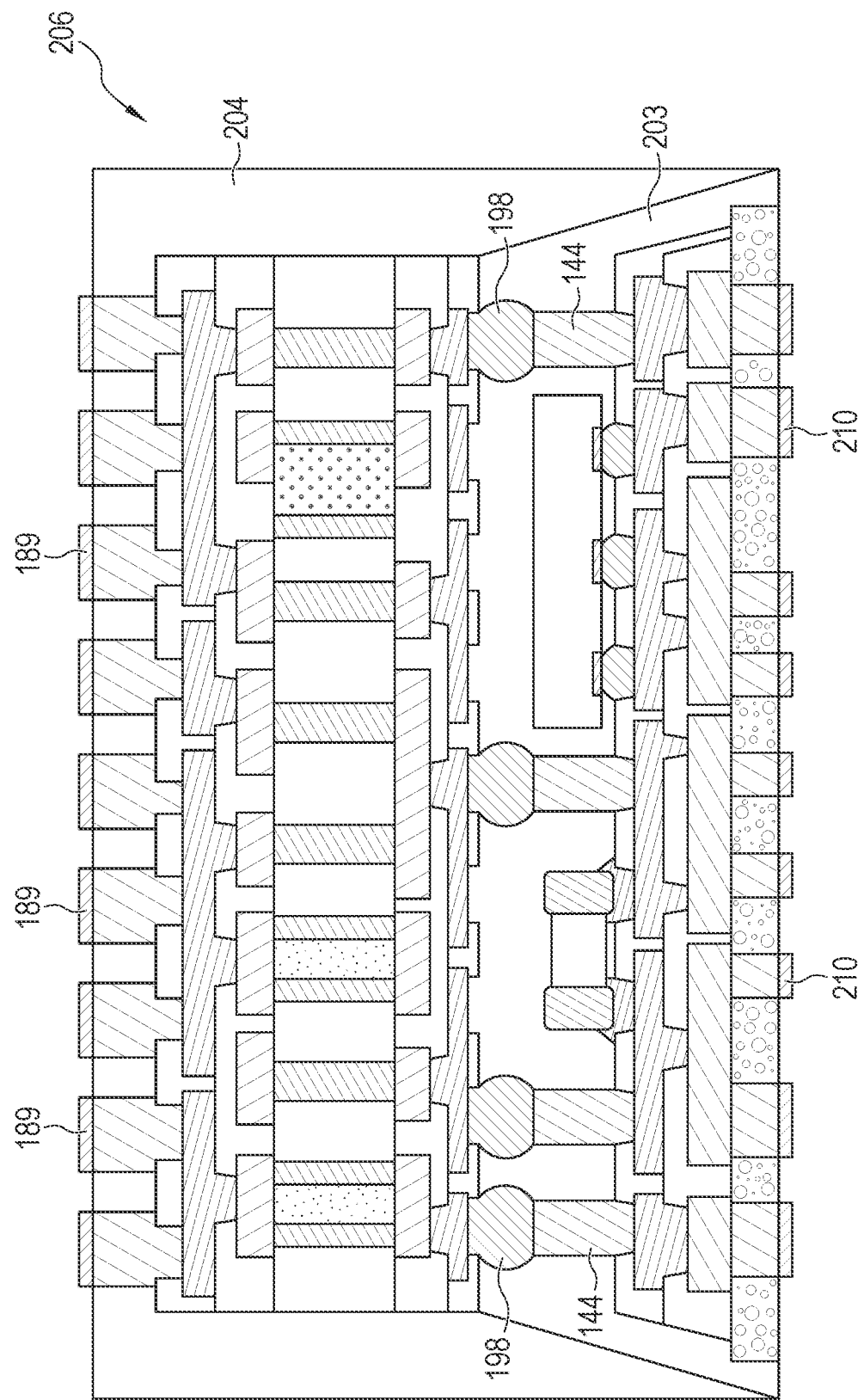

In FIG. 4e, hybrid substrate 200 undergoes grinding with grinder 208 to expose finish 189 on conductive pillars 188. Another Cu OSP, or ENEPIG, or ENIG or immerging tin, or solder cap finish or layer 189 can be formed on exposed pads or metal surfaces. In FIG. 4f, carrier 120 is removed by chemical etching, chemical mechanical polishing (CMP), mechanical peel-off, mechanical grinding, thermal bake, ultra-violet (UV) light, or wet stripping to expose conductive layer 132 and provide hybrid substrate assembly 206. Grinding may occur pre or post carrier removal. Another Cu OSP, or ENEPIG, or ENIG or immerging tin, or solder cap finish or layer 189 can be formed on exposed pads or metal surfaces. FIG. 4f shows further detail of features of hybrid substrate assembly 206. In particular, insulating layer 130 includes one or more fillers 131, such as solder mask or molding sheet. Conductive layer 132 can have Cu OSP, or ENEPIG, or ENIG or immerging tin, or solder cap finish or layer 210 formed on exposed pads or metal surfaces. Layer 210 can be lower, equal, or higher than insulating layer 130. Hybrid substrate assembly 206 has high density routing and high I/O capability, and higher PI/SI capability for high power and HPC to be useful in automotive applications.

FIG. 5 shows multiple units of hybrid substrate assembly 206 on panel 212. Hybrid substrate assembly 206 is singulated along lines 214 and 216 into individual hybrid substrate assemblies. Alternatively, carrier 120 is singulated and electrical interconnect structures 142 are bonded to hybrid substrate 200 as individual units. In another embodiment, different layer count and different build-up materials for different line/space substrates are pre-stacked for better yield management and lower overall cost and equal or better performance.

Figure 6:
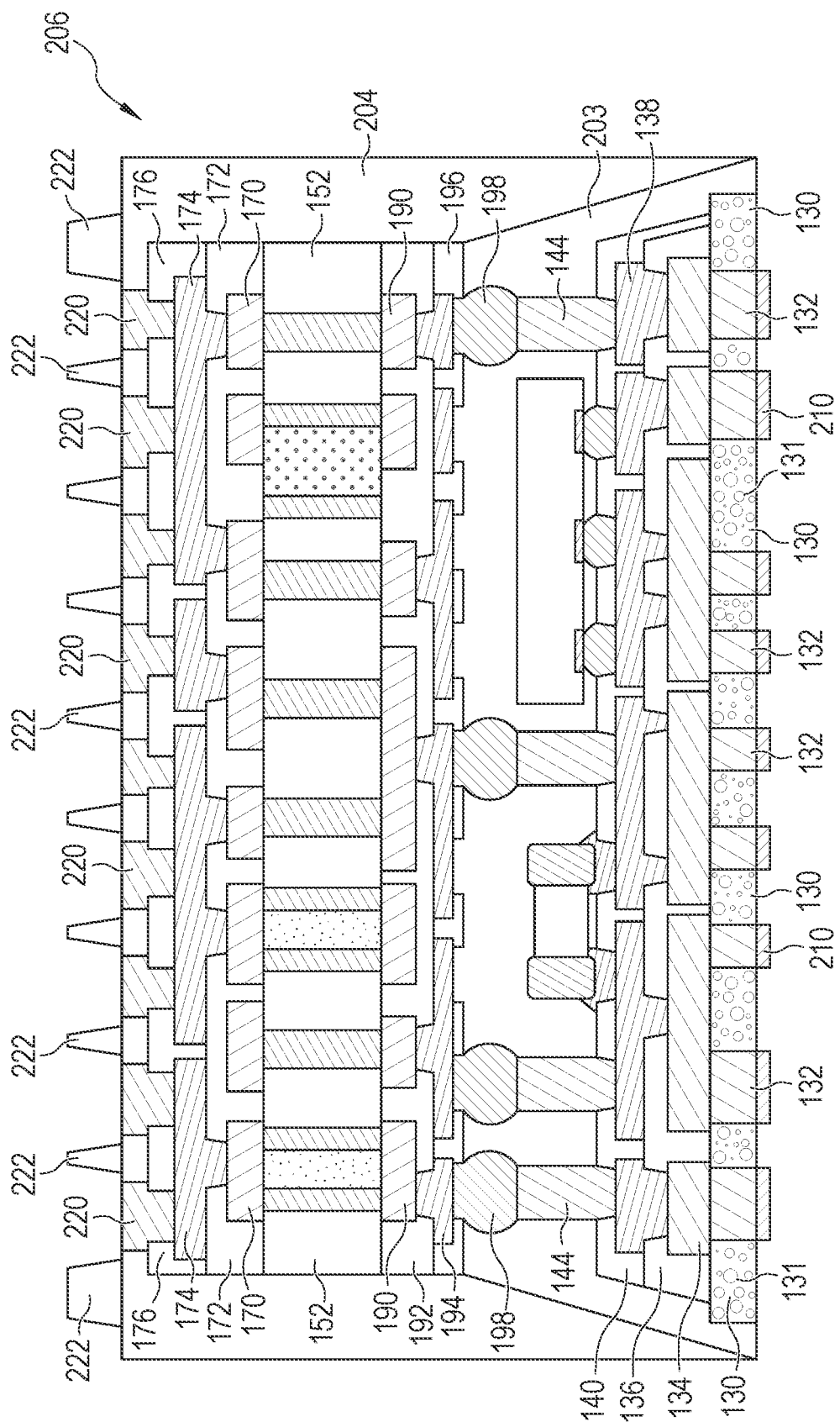
FIG. 6 illustrates another embodiment of the hybrid substrate assembly.

FIG. 6 shows an embodiment, similar to FIG. 4f, with an insulating layer 222 formed over encapsulant 204 and insulating layer 176, after grinding. Insulating layer 222 is similar to insulating layer 130 as a polymer composite with one or more fillers, such as solder mask or molding sheet, with a thickness of less than 25 µm. A portion of insulating layer 222 and encapsulant 204 is removed to expose conductive layer 174. BGA solder cap 220 is formed over conductive layer 174, in lieu of conductive pillars 188.

Figure 7A:
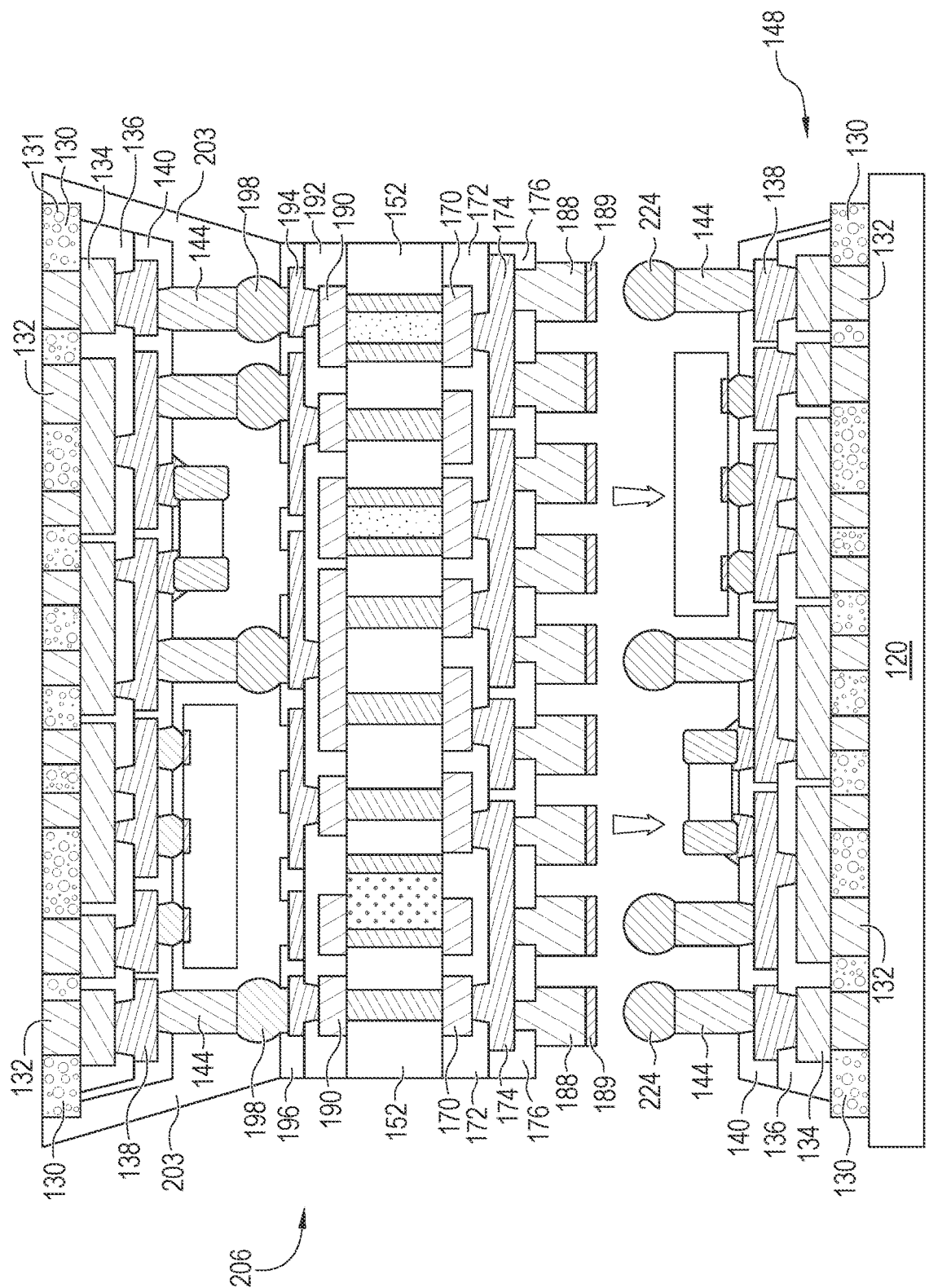
FIGS. 7a-7c illustrate another process of forming a hybrid substrate assembly.
Figure 7B:
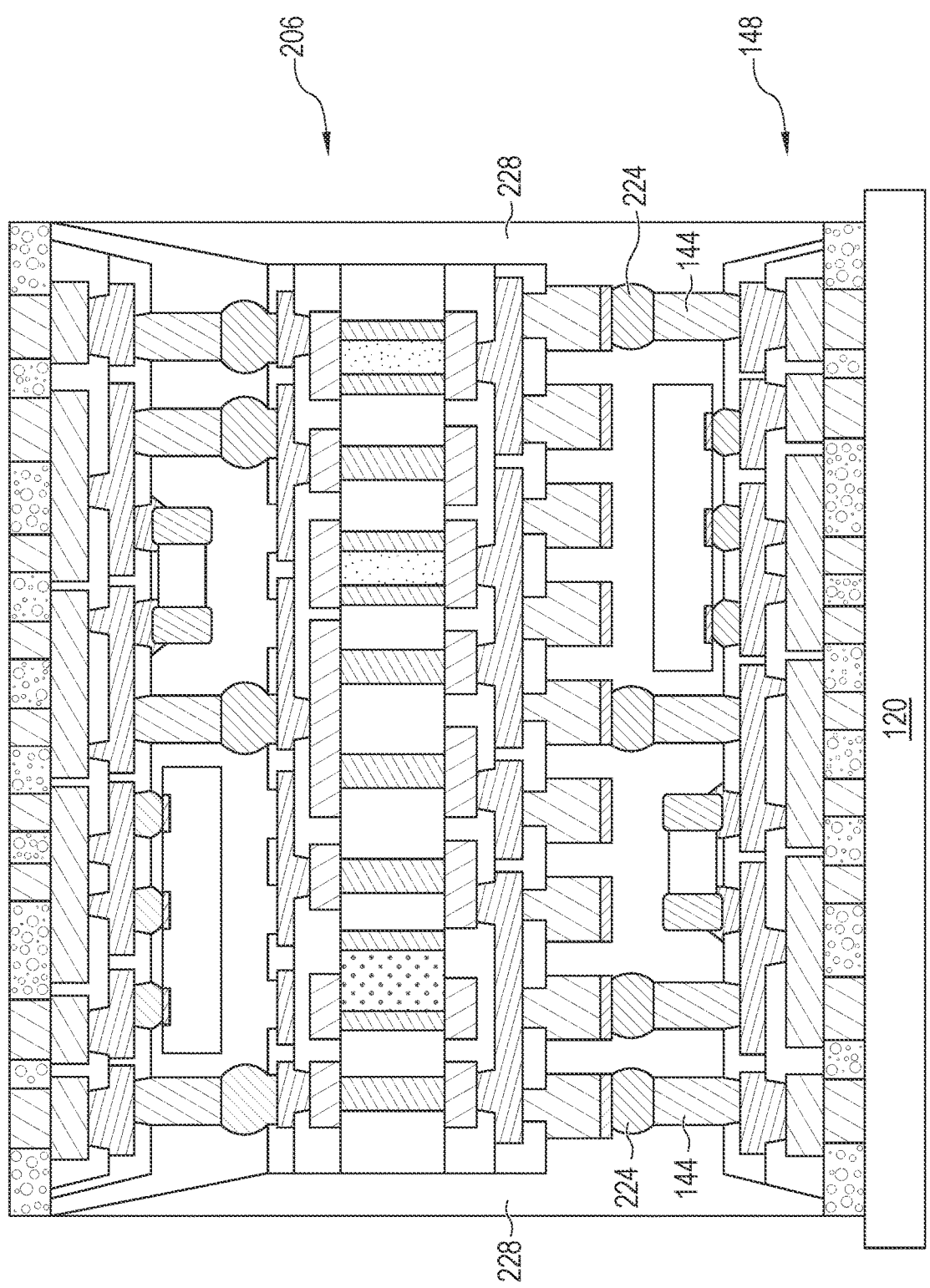

In FIG. 7a, hybrid substrate assembly 206 from FIG. 4f, minus encapsulant 204, is disposed over a second RDL component assembly 148 as formed on carrier 120 from FIG. 2h. Bumps 224 are formed on conductive pillars 144 or conductive pillars 188. In this case, bumps 224 are brought into contact with conductive pillars 188 and reflowed to mechanically and electrically connect hybrid substrate assembly 206 to the second RDL component assembly 148, indicated as hybrid substrate assembly 226 and shown in FIG. 7b.

An encapsulant or molding compound 228 is deposited over and around hybrid substrate assembly 226 using a paste printing, compressive molding, transfer molding, liquid encapsulant molding, vacuum lamination, spin coating, or other suitable applicator. Encapsulant 228 can be liquid or granular polymer composite material, such as epoxy resin with filler, epoxy acrylate with filler, or polymer with proper filler. Encapsulant 228 is non-conductive, provides structural support, and environmentally protects the semiconductor device from external elements and contaminants. In particular, encapsulant 228 is deposited post formation of hybrid substrate assembly 226. Conductive pillars 144, electrical components 146a-146b, and bumps 224 are embedded within encapsulant 228.

Figure 7C:
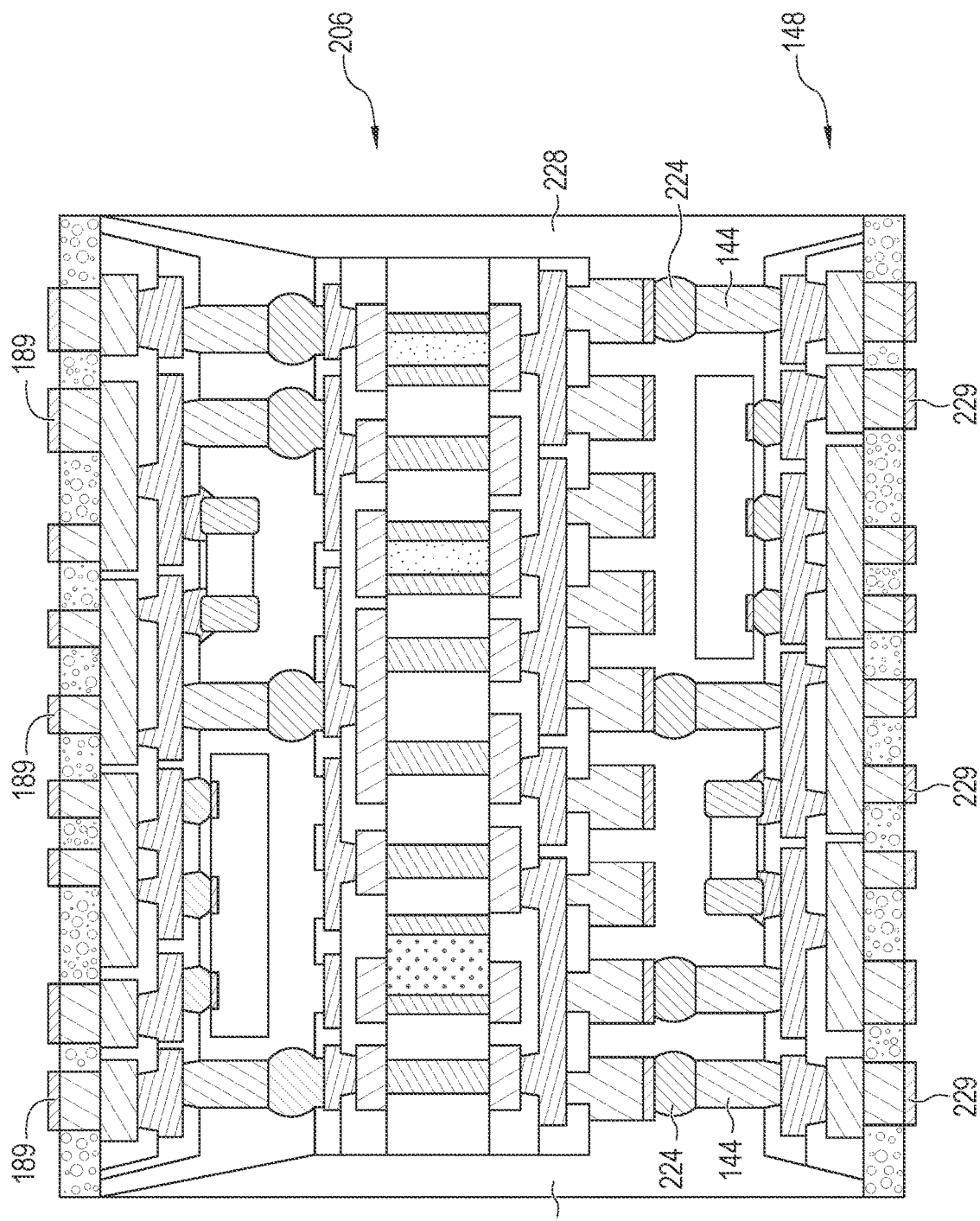

In FIG. 7c, carrier 120 is removed by chemical etching, CMP, mechanical peel-off, mechanical grinding, thermal bake, UV light, or wet stripping to expose conductive layer 132 and provide hybrid substrate assembly 230. Grinding may occur pre or post carrier removal. Conductive layer 132 can have Cu OSP, or ENEPIG, or ENIG or immerging tin, or solder cap finish or layer 229 formed on exposed pads or metal surfaces. Hybrid substrate assembly 206 with second RDL component assembly 148 constitute hybrid substrate assembly 230.

Figure 8A:
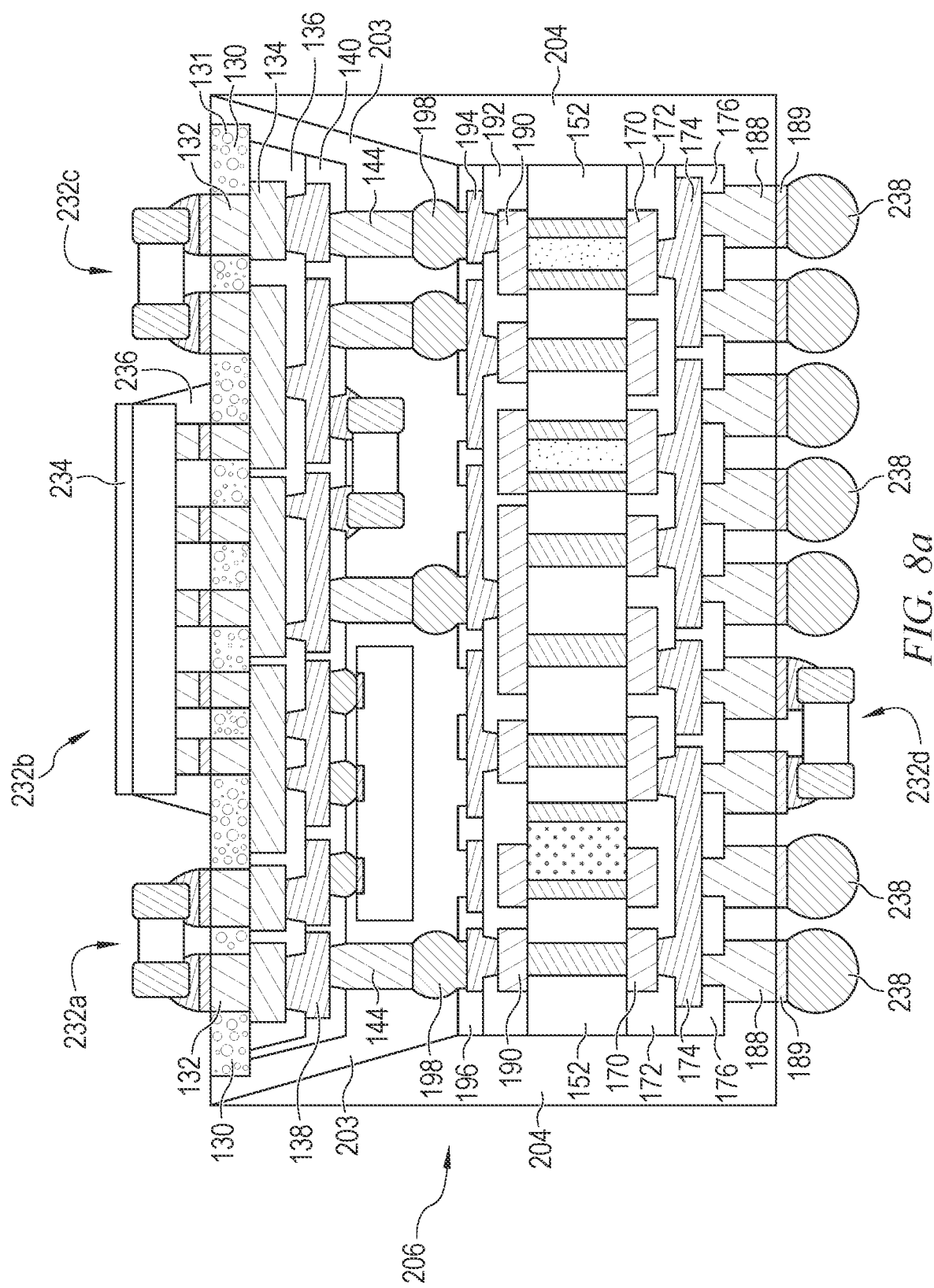
FIGS. 8a-8c illustrate disposing electrical components and shielding over the hybrid substrate assembly.

In another embodiment, continuing from FIG. 4f, a plurality of electrical components 232a-232d is disposed on hybrid substrate assembly 206 and electrically and mechanically connected to conductive layer 132 and conductive pillars 188, similar to FIGS. 2g-2h, as shown in FIG. 8a. For example, electrical component 232b can be similar to semiconductor die 104 from FIG. 1c with bumps 114 oriented toward hybrid substrate assembly 206. Electrical components 232a, 232c, and 232d can be discrete electrical devices, or IPDs, such as a diode, transistor, resistor, capacitor, and inductor. Alternatively, electrical component 232a-232d can include other semiconductor die, semiconductor packages, surface mount devices, discrete electrical devices, or IPDs. A thermal interface material (TIM) 234 is deposited over the top surface of electrical component 232b. An underfill material 236, such as epoxy resin, can be deposited around bumps 114 and under electrical component 232b.

An electrically conductive bump material is deposited over conductive pillars 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillar 188 using a suitable attachment or bonding process. In one embodiment, the bump material is reflowed by heating the material above its melting point to form balls or bumps 238. In one embodiment, bump 238 is formed over a UBM having a wetting layer, barrier layer, and adhesive layer. Bump 238 can also be compression bonded or thermocompression bonded to conductive pillar 188. In one embodiment, bump 238 is a copper core bump for durability and maintaining its height. Bump 238 represents one type of interconnect structure that can be formed over conductive pillar 188. The interconnect structure can also use bond wires, conductive paste, stud bump, micro bump, or other electrical interconnect.

Electrical components within or attached to hybrid substrate assembly 206 may contain IPDs that are susceptible to or generate EMI, RFI, harmonic distortion, and inter-device interference. For example, the IPDs contained within semiconductor die 104 or electrical components 232a-232d provide the electrical characteristics needed for high-frequency applications, such as resonators, high-pass filters, low-pass filters, band-pass filters, symmetric Hi-Q resonant transformers, and tuning capacitors. In another embodiment, semiconductor die 104 or electrical components 232a-232d contain digital circuits switching at a high frequency, which could interfere with the operation of other IPDs.

Figure 8B:
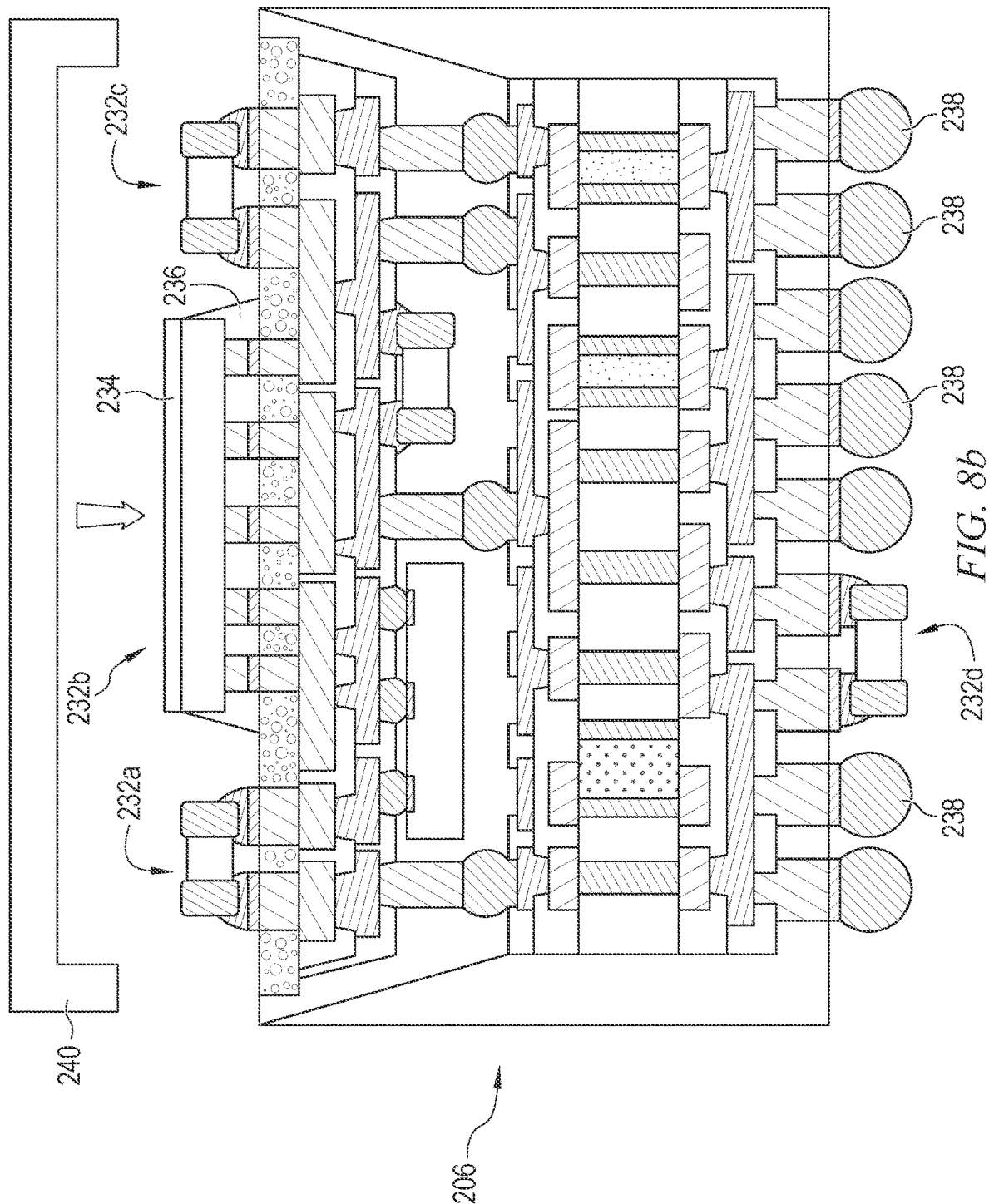
Figure 8C:
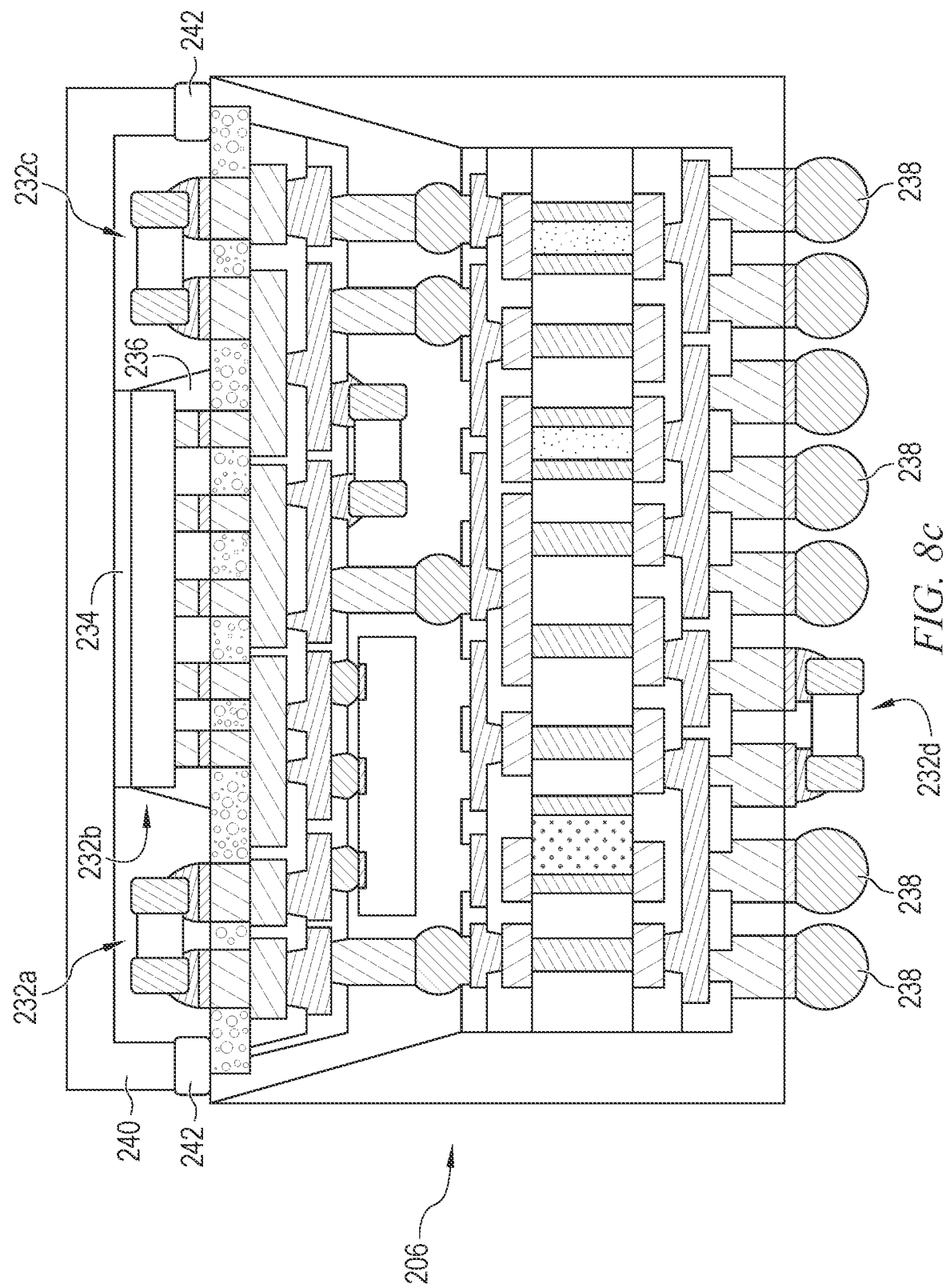

To address EMI, RFI, harmonic distortion, and inter-device interference, shielding frame 240 is positioned over hybrid substrate assembly 206, as shown in FIG. 8b. Shielding frame 240 can be one or more layers of Al, Cu, Sn, Ni, Au, Ag, or other suitable conductive material. Alternatively, shielding frame 240 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In FIG. 8c, shielding frame 240 is brought into contact with hybrid substrate assembly 206 and grounded through conductive layer 132 with conductive paste 242.

Alternatively, frame 240 can be a heat sink or heat spreader with thermal interface material. The heat sink can be one or more layers of Al, Cu, Sn, Ni, Au, Ag, or other suitable thermally conductive material. Heat sink 240 dissipates heat generated by hybrid substrate assembly 206. Hybrid substrate assembly 206 with electrical components 232a-232d and shielding frame 240 constitute hybrid substrate assembly 248.

Figure 9A:
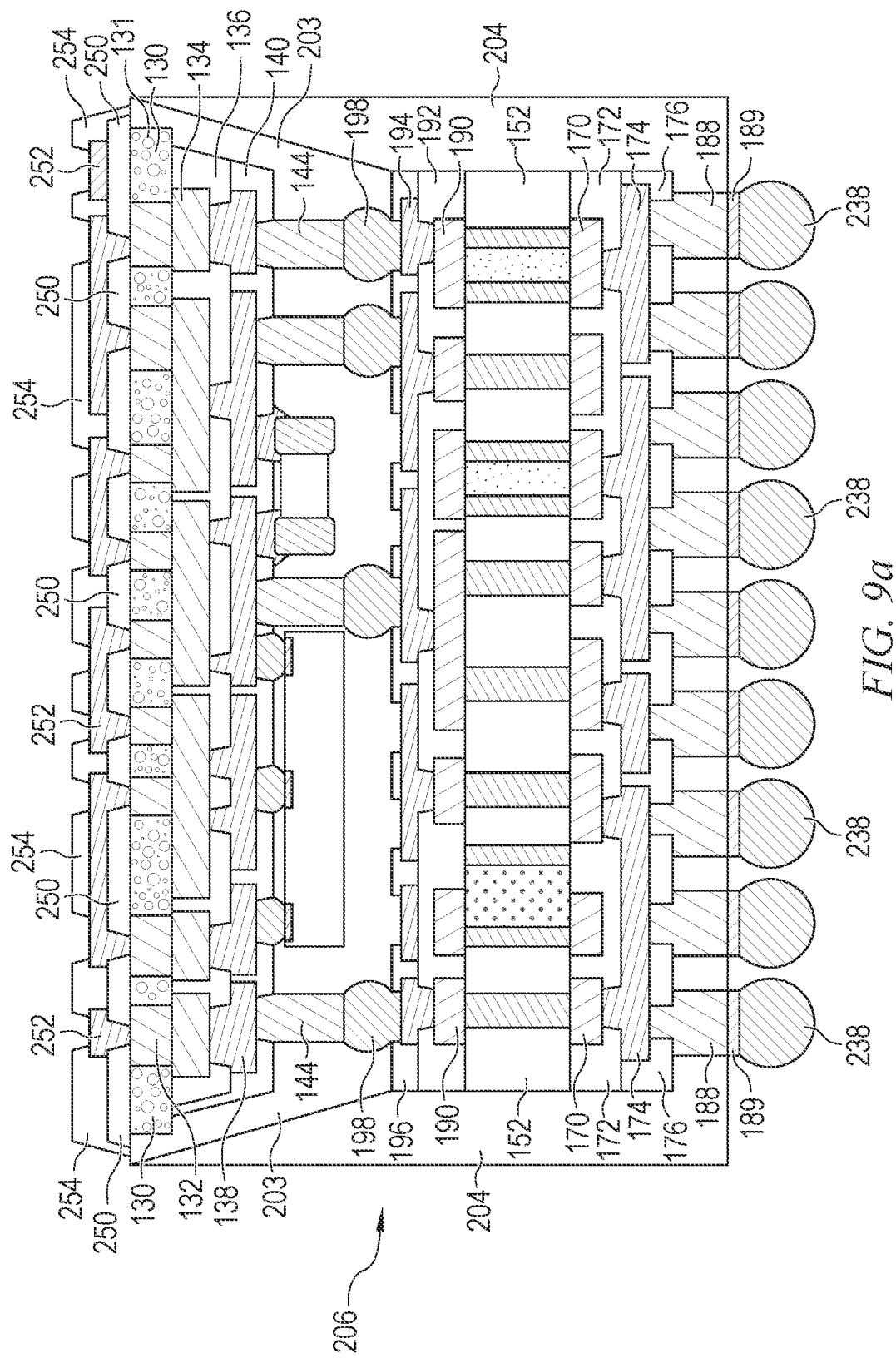
FIGS. 9a-9b illustrate disposing additional RDL and electrical components over the hybrid substrate assembly.

In another embodiment, continuing from FIG. 4f, insulating or passivation layer 250 is formed over insulating layer 130 and conductive layer 132 of hybrid substrate assembly 206 using PVD, CVD, printing, lamination, spin coating, spray coating, sintering or thermal oxidation, as shown in FIG. 9a. Insulating layer 250 contains one or more layers of SiO2, Si3N4, SiON, Ta2O5, Al2O3, solder resist, polyimide, BCB, PBO, and other material having similar insulating and structural properties. Portions of insulating layer 250 are removed using an etching process or LDA to expose conductive layer 132 for further electrical interconnect.

A conductive layer 252 is formed over conductive layer 132 and insulating layer 250 using PVD, CVD, electrolytic plating, electroless plating process, or other suitable metal deposition process. Conductive layer 252 can be one or more layers of Al, Cu, Sn, Ni, Au, Ag, or other suitable electrically conductive material. Conductive layer 252 is an RDL and provides horizontal and vertical electrical interconnect across hybrid substrate assembly 206. Portions of conductive layer 252 can be electrically common or electrically isolated depending on the design and function of semiconductor die and other electrical components attached thereto.

An insulating or passivation layer 256 is formed over conductive layer 252 and insulating layer 250 using PVD, CVD, printing, lamination, spin coating, spray coating, sintering or thermal oxidation. Insulating layer 256 contains one or more layers of SiO2, Si3N4, SiON, Ta2O5, Al2O3, solder resist, polyimide, BCB, PBO, and other material having similar insulating and structural properties. Insulating layer 256 provides isolation around conductive layer 252. Portions of insulating layer 256 are removed using an etching process or LDA to expose conductive layer 194 for further electrical interconnect.

Figure 9B:
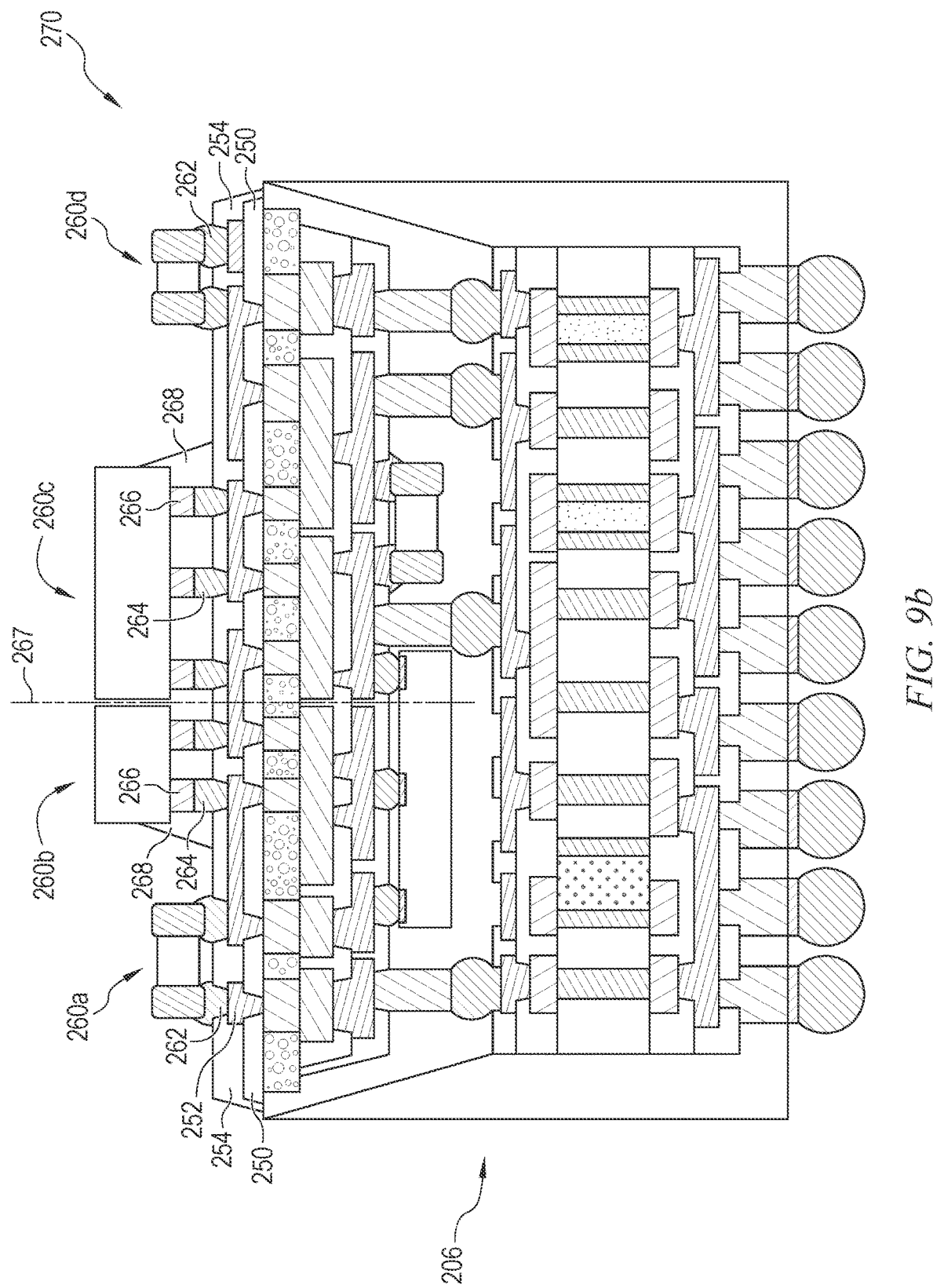

In FIG. 9b, a plurality of electrical components 260a-260d is disposed on hybrid substrate assembly 206 and electrically and mechanically connected to conductive layer 252, similar to FIGS. 2g-2h. For example, electrical component 260b and 260c can be similar to semiconductor die 104 from FIG. 1c, albeit with a different form and function, with bumps 264 and 266 oriented toward hybrid substrate assembly 206. Electrical components 260a and 260d can be discrete electrical devices, or IPDs, such as a diode, transistor, resistor, capacitor, and inductor. Alternatively, electrical component 260a-260d can include other semiconductor die, semiconductor packages, surface mount devices, discrete electrical devices, or IPDs. Electrical components 260a and 260d are mechanically and electrically connected to conductive layer 252 with conductive paste 262. Note that electrical component 146b crosses over line 267 between electrical components 260b and 260c. An underfill material 268, such as epoxy resin, can be deposited around bumps 264 and 266 and under electrical components 260b and 260c. Hybrid substrate assembly 206 with additional RDL 250-256, and electrical components 260a-260d constitute hybrid substrate assembly 270.

Figure 10:
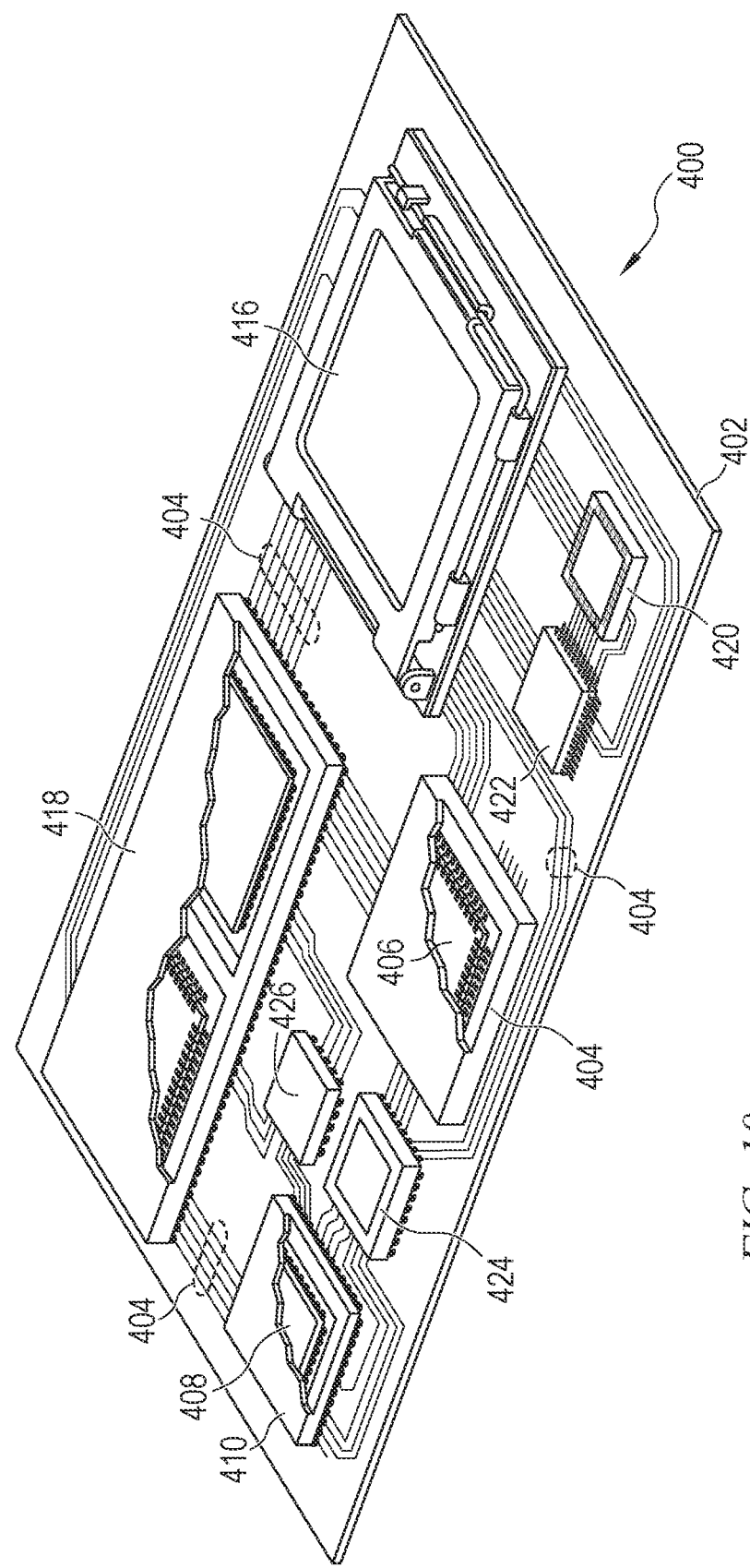
FIG. 10 illustrates a printed circuit board (PCB) with different types of packages disposed on a surface of the PCB.

FIG. 10 illustrates electrical device 400 having a chip carrier substrate or PCB 402 with a plurality of semiconductor packages disposed on a surface of PCB 402, including hybrid substrate assemblies 206, 230, 248, and 270. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 10, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a first redistribution layer (RDL) substrate;
    forming a plurality of first conductive pillars over a first surface of the first RDL substrate;
    disposing a first electrical component over the first surface of the first RDL substrate;
    providing a hybrid substrate;
    bonding the hybrid substrate to the first RDL substrate;
    depositing an encapsulant around the hybrid substrate and first RDL substrate with the first conductive pillars and first electrical component embedded within the encapsulant;
    providing a second RDL substrate;
    disposing a plurality of second conductive pillars over the second RDL substrate;

disposing a second electrical component over the second RDL substrate between the second conductive pillars; and bonding the hybrid substrate to the second RDL substrate.

2. The method of claim 1, wherein providing the hybrid substrate includes:
providing a core substrate;
forming a first RDL over a first surface of the core substrate;
forming a plurality of second conductive pillars over the first RDL; and
forming a second RDL over a second surface of the core substrate opposite the first surface of the core substrate.

3. The method of claim 1, wherein providing the first RDL substrate includes:
providing a carrier;
forming an RDL over a surface of the carrier; and
removing the carrier after bonding the hybrid substrate to the first RDL substrate.

4. The method of claim 1, further including disposing a third electrical component over a second surface of the first RDL substrate opposite the first surface of the first RDL substrate.

5. The method of claim 4, further including disposing a shielding frame over the third electrical component.

6. A method of making a semiconductor device, comprising:
providing a first redistribution layer (RDL) substrate;
forming a plurality of first conductive pillars over a first surface of the first RDL substrate;
disposing a first electrical component over the first surface of the first RDL substrate;
providing a hybrid substrate;
bonding the hybrid substrate to the first RDL substrate; and
disposing a second electrical component over a second surface of the first RDL substrate opposite the first surface of the first RDL substrate.

7. The method of claim 6, further including depositing an encapsulant around the hybrid substrate and first RDL substrate with the first conductive pillars and first electrical component embedded within the encapsulant.

8. The method of claim 6, wherein providing the hybrid substrate includes:
providing a core substrate;
forming a first RDL over a first surface of the core substrate;
forming a plurality of second conductive pillars over the first RDL; and
forming a second RDL over a second surface of the core substrate opposite the first surface of the core substrate.

9. The method of claim 6, wherein providing the first RDL substrate includes:
providing a carrier;
forming an RDL over a surface of the carrier; and
removing the carrier after bonding the hybrid substrate to the first RDL substrate.

10. The method of claim 6, further including:
providing a second RDL substrate;
disposing a plurality of second conductive pillars over the second RDL substrate;
disposing a third electrical component over the second RDL substrate between the second conductive pillars; and
bonding the hybrid substrate to the second RDL substrate.

11. The method of claim 6, further including disposing a shielding frame over the second electrical component.

12. A semiconductor device, comprising:
a first redistribution layer (RDL) substrate;
a plurality of first conductive pillars formed over a first surface of the first RDL substrate;
a first electrical component disposed over the first surface of the first RDL substrate;
a hybrid substrate bonded to the first RDL substrate;
an encapsulant deposited around the hybrid substrate and first RDL substrate with the first conductive pillars and first electrical component embedded within the encapsulant; and
a first RDL formed over a second surface of the first RDL substrate opposite the first surface of the first RDL substrate.

13. The semiconductor device of claim 12, wherein the hybrid substrate includes:
a core substrate;
a second RDL formed over a first surface of the core substrate;
a plurality of second conductive pillars formed over the second RDL; and
a third RDL formed over a second surface of the core substrate opposite the first surface of the core substrate.

14. The semiconductor device of claim 12, further including:
a second RDL substrate;
a plurality of second conductive pillars formed over the second RDL substrate; and
a second electrical component disposed over the second RDL substrate between the second conductive pillars, wherein the hybrid substrate is bonded to the second RDL substrate.

15. The semiconductor device of claim 12, further including a second electrical component disposed over a second surface of the first RDL substrate opposite the first surface of the first RDL substrate.

16. The semiconductor device of claim 15, further including a shielding frame disposed over the second electrical component.

17. A semiconductor device, comprising:
a first redistribution layer (RDL) substrate;
a plurality of first conductive pillars formed over the first RDL substrate;
a first electrical component disposed over the first RDL substrate;
a hybrid substrate bonded to the first RDL substrate, wherein the hybrid substrate includes, (a)
(a) a core substrate,
(b) a first RDL formed over a first surface of the core substrate,
(c) a plurality of second conductive pillars formed over the first RDL, and
(d) a second RDL formed over a second surface of the core substrate opposite the first surface of the core substrate.

18. The semiconductor device of claim 17, further including an encapsulant deposited around the hybrid substrate and first RDL substrate with the first conductive pillars and first electrical component embedded within the encapsulant.

19. The semiconductor device of claim 17, further including:
a second RDL substrate;
a plurality of second conductive pillars formed over the second RDL substrate;

a second electrical component disposed over the second RDL substrate between the second conductive pillars, wherein the hybrid substrate is bonded to the second RDL substrate.

20. The semiconductor device of claim 17, further including a second electrical component disposed over a second surface of the first RDL substrate opposite the first surface of the first RDL substrate.

21. The semiconductor device of claim 20, further including a shielding frame disposed over the second electrical component.

* * * * *